US012701747B2

(12) United States Patent
Chen et al.

(10) Patent No.: US 12,701,747 B2
(45) Date of Patent: Aug. 4, 2026

(54) SEMICONDUCTOR DEVICE WITH BACKSIDE INTERCONNECTION AND METHOD FOR FORMING THE SAME

(71) Applicant: Taiwan Semiconductor Manufacturing Company, Ltd., Hsin-Chu (TW)

(72) Inventors: Jui-Lin Chen, Taipei City (TW); Hsin-Wen Su, Hsinchu (TW); Chih-Ching Wang, Kinmen County (TW); Chen-Ming Lee, Yangmei City (TW); Chung-I Yang, Hsinchu City (TW); Yi-Feng Ting, Taipei City (TW); Jon-Hsu Ho, New Taipei City (TW); Lien-Jung Hung, Taipei (TW); Ping-Wei Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 538 days.

(21) Appl. No.: 18/187,847

(22) Filed: Mar. 22, 2023

(65) Prior Publication Data

US 2024/0154015 A1 May 9, 2024

Related U.S. Application Data

(60) Provisional application No. 63/382,323, filed on Nov. 4, 2022.

(51) Int. Cl.
H10D 30/67 (2025.01)
H10B 10/00 (2023.01)
(Continued)

(52) U.S. Cl.
CPC ......... H10D 30/6735 (2025.01); H10B 10/12 (2023.02); H10D 30/012 (2025.01);
(Continued)

(58) Field of Classification Search
CPC .. H10D 30/6735; H10D 30/014; H10D 30/43; H10D 30/024; H10D 30/62;
(Continued)

(56) References Cited

U.S. PATENT DOCUMENTS 8,772,109 B2 7/2014 Colinge
8,785,285 B2 7/2014 Tsai et al.
(Continued)

FOREIGN PATENT DOCUMENTS

TW 201601275 A 1/2016

*Primary Examiner* — Tuan A Hoang
(74) *Attorney, Agent, or Firm* — HAYNES AND BOONE, LLP

(57) ABSTRACT

A method includes forming a first fin and a second fin protruding from a frontside of a substrate, forming a gate stack over the first and second fins, forming a dielectric feature dividing the gate stack into a first segment engaging the first fin and a second segment engaging the second fin, and growing a first epitaxial feature on the first fin and a second epitaxial feature on the second fin. The dielectric feature is disposed between the first and second epitaxial features. The method also includes performing an etching process on a backside of the substrate to form a backside trench, and forming a backside via in the backside trench. The backside trench exposes the dielectric feature and the first and second epitaxial features. The backside via straddles the dielectric feature and is in electrical connection with the first and second epitaxial features.

20 Claims, 17 Drawing Sheets

(51) Int. Cl.

| | |
|---|---|
| *H10D 30/01* | (2025.01) |
| *H10D 30/43* | (2025.01) |
| *H10D 30/62* | (2025.01) |
| *H10D 62/10* | (2025.01) |
| *H10D 84/01* | (2025.01) |
| *H10D 84/03* | (2025.01) |
| *H10D 84/83* | (2025.01) |
| *H10W 20/00* | (2026.01) |
| *H10W 20/42* | (2026.01) |

(52) U.S. Cl.
CPC ......... *H10D 30/014* (2025.01); *H10D 30/024* (2025.01); *H10D 30/43* (2025.01); *H10D 30/62* (2025.01); *H10D 30/6757* (2025.01); *H10D 62/121* (2025.01); *H10D 84/0193* (2025.01); *H10D 84/038* (2025.01); *H10D 84/834* (2025.01); *H10W 20/056* (2026.01); *H10W 20/42* (2026.01)

(58) Field of Classification Search
CPC .......... H10D 84/0158; H10D 84/0193; H10D 84/834; H10D 84/0151; H10D 84/0188; H10D 62/121; H01L 21/768; H01L 21/76897; H01L 21/76898
See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 11,688,780 B2* | 6/2023 | Mehandru | H10D 30/62 257/401 |
| 2020/0006354 A1* | 1/2020 | Wen | H10B 10/12 |
| 2020/0303509 A1* | 9/2020 | Mehandru | H10D 30/62 |
| 2021/0098468 A1* | 4/2021 | Chen | H10D 89/10 |
| 2021/0202385 A1 | 7/2021 | Huang et al. | |
| 2021/0305428 A1* | 9/2021 | Ju | H10D 30/6211 |
| 2021/0343332 A1 | 11/2021 | Chiu et al. | |
| 2022/0093448 A1 | 3/2022 | Yu et al. | |
| 2022/0157949 A1 | 5/2022 | Huang et al. | |

* cited by examiner

600

Backside 602
604
606
618
610
608 {
608a
608b
608c

619

612
622
620
616
614

624

626

628

630

640

-Z

Y

Frontside

600

Backside 604
606
618
610
608a
608 608b
608c
612
622
620
616
614

619

626

628

624

630

640

-Z

Y

Frontside

SEMICONDUCTOR DEVICE WITH BACKSIDE INTERCONNECTION AND METHOD FOR FORMING THE SAME

PRIORITY DATA

This application claims priority to U.S. Provisional Patent Application No. 63/382,323 filed on Nov. 4, 2022, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, an IC includes various circuits with respective functions, such as a memory circuit having a plurality of memory bit cells to retain information. The memory circuit includes non-volatile devices or volatile devices. The volatile devices may include static-random-access memory (SRAM) devices. Three dimensional transistors with fin-like active regions are often implemented for enhanced device performance. The fin-like active region may be a continuous fin protruding from a substrate or a stack of channels suspended over a substrate. Those three-dimensional field effect transistors (FETs) formed on fin-like active regions are also referred to as FinFETs or gate-all-around (GAA) FETs, respectively. With the scaling down of the device sizes, those FETs often have narrow fin width for short channel control, which leads to smaller source/drain regions than those of planar FETs. This will reduce the alignment margins and cause issues for further shrunken device pitches and increasing packing density. Furthermore, when metal interconnect is continuously scaling down to less feature sizes for circuit routing density improvement, the existing interconnect structure schemes face various issues in tighter pitch metal layers. For example, there is metal filling problems due to metal lines or metal plugs require diffusion barrier metal layer for reliability consideration and the barrier layer further reduce the sizes of the metal lines and metal plugs. These barrier metal layers will impact the trench filling capability and therefore, result in metal resistance degradation or even worse, such as via opening or electro-migration (EM) concern. Other issues with the scaling down of the device sizes include increased routing resistance, increased parasitic capacitance, shorting, leakage, alignment margins, layout flexibility, and packing density. Therefore, there is a need for a structure and method for memory circuits, such as SRAM devices, and method making the same to address these concerns with enhanced circuit performance and reliability, and increased packing density.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
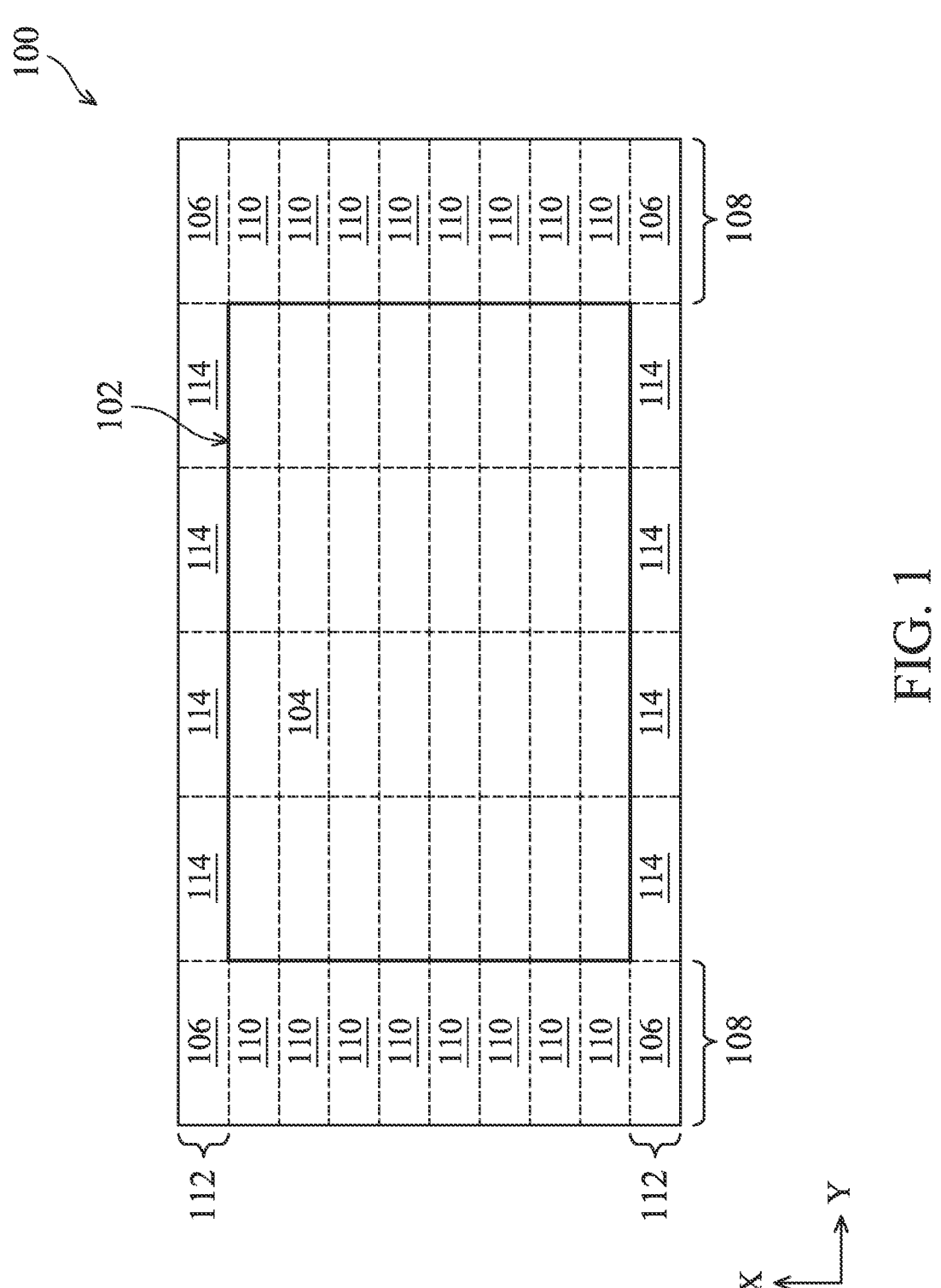
FIG. 1 is a schematic view of an integrated circuit having static random-access memory (SRAM) devices, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about,"

"approximate," and the like, the term is intended to encompass numbers that are within +/−10% of the number described, unless otherwise specified. For example, the term "about 5 nm" encompasses the dimension range from 4.5 nm to 5.5 nm.

The present disclosure provides various embodiments of a memory device and a method making the same. Particularly, the present disclosure provides various embodiments of a static-random-access memory (SRAM) device structure with power lines (such as a higher power line Vdd, a lower power line Vss), vias (or metal plugs) to power lines, and signal lines (such as bit lines and word lines) distributed on the frontside and backside of the substrate such that the overall device performance is enhance among various trade-off parameters, such as metal routing resistance and parasitic capacitance. In some embodiments, two adjacent backside vias disposed on two source/drain regions may be parts of a continuous conductive feature that straddles a cut-metal-gate (CMG) feature.

A cut-metal-gate (CMG) process refers to a fabrication process where after a metal gate (e.g., a high-k metal gate or HK MG) replaces a dummy gate structure (e.g., a polysilicon gate), the metal gate is cut (e.g., by an etching process) to separate the metal gate into two or more gate segments. Each gate segment functions as a metal gate for an individual transistor. An isolation material is subsequently filled into trenches between adjacent portions of the metal gate. These trenches are referred to as cut-metal-gate trenches, or CMG trenches, in the present disclosure. The dielectric material filling a CMG trench for isolation is referred to as a CMG feature. To ensure a metal gate would be completely cut, a CMG feature often further extends into adjacent areas, such as dielectric layers filling space between the metal gates. A CMG feature often have an elongated shape in a top view. By having two adjacent backside vias as parts of a conductive feature straddling a CMG feature enlarges process window and reduces routing resistance.

FIG. 1 is a top view of an integrated circuit (IC) structure 100 (or semiconductor device 100) constructed according to various aspects of the present disclosure in some embodiments. In some embodiments, the integrated circuit structure 100 is formed on flat active regions and includes field-effect transistors (FETs). In some embodiments, the integrated circuit structure 100 is formed on fin active regions and includes fin field-effect transistors (FinFETs). In some embodiments, the integrated circuit structure 100 includes other three-dimensional active regions, such as multiple channel layers vertically stacked on the substrate. The corresponding FET has a gate stack around the multiple channel layers vertically stacked, therefore also being referred to as gate-all-around (GAA) FET structure. The integrated circuit structure 100 includes a static-random-access memory (SRAM) circuit having a SRAM array 102 of a plurality of SRAM bit cells (or SRAM cells) 104 configured in an array, spanning into multiple columns along and multiple rows. The integrated circuit structure 100 may further include other devices/circuit modules (such as logic devices, high-frequency devices, image-sensing devices, dynamic-random-access memory (DRAM) devices or a combination thereof) integrated with the SRAM devices. In the present embodiments, each column of the SRAM bit cells 104 in the array spans along the X direction and each row spans along the Y direction. For examples, each column may include N1 SRAM bit cells configured in a line (a column) along the X direction, and each row may include N2 SRAM bit cells configured in a line (a row) along the Y direction. In other words, the SRAM array 102 includes SRAM bit cells configured in N1 rows and N2 column. In some examples of the SRAM array 102, each column includes 8, 16, 32, 64 or 128 SRAM bit cells, and each row may include 4, 8, 16, or 32 SRAM bit cells. In the example illustrated in FIG. 1, the SRAM array 102 includes 4 columns and 8 rows.

The integrated circuit structure 100 further includes corner dummy cells 106 disposed on four corners of the SRAM array 102 and edge straps, such as word-line edge straps (WL edge straps) 108 disposed on raw edges of the SRAM array 102 and bit-line edge straps (BL edge straps) 112 disposed on column edges of the SRAM array 102. Each WL edge strap 108 includes a plurality of WL edge cells 110 configured in a line along X direction and each BL edge strap 112 includes a plurality of BL edge cells 114 configured in a line along Y direction. Those edge straps (108 and 110) are circuit regions not designed to serve as SRAM bit cells but to provide other circuit functions.

Figure 2:
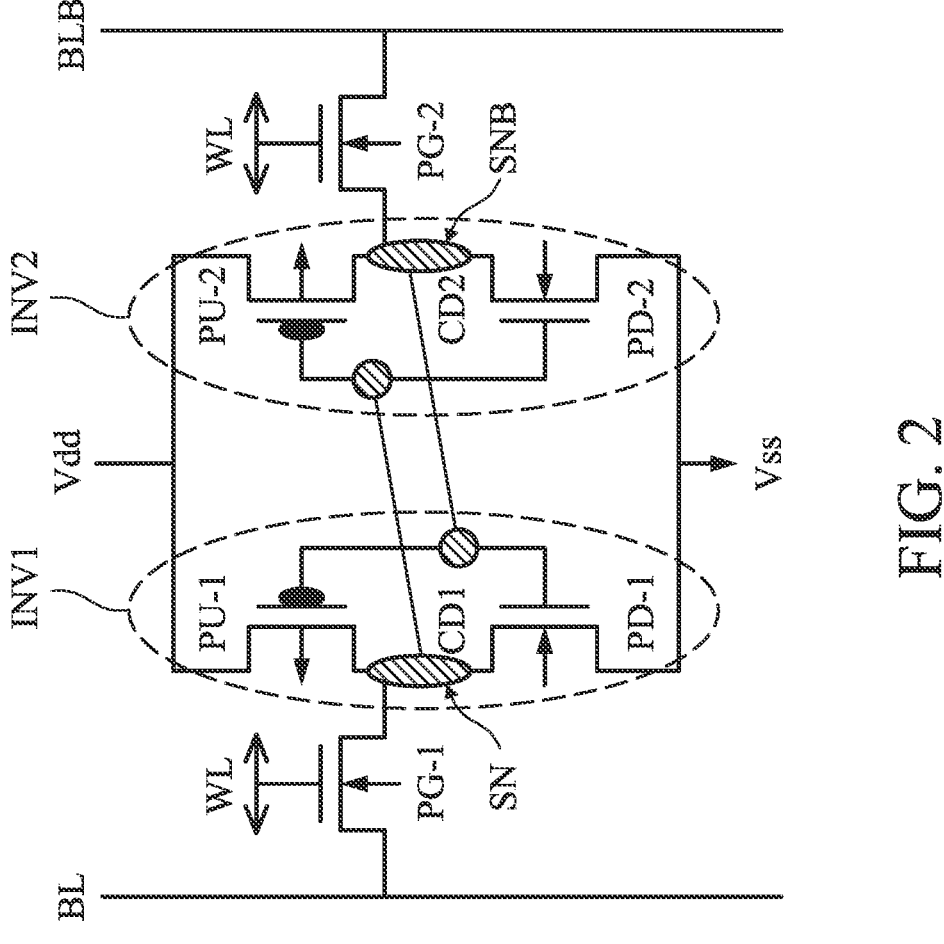
FIG. 2 is a schematic view of an SRAM bit cell in the integrated circuit of FIG. 1, in accordance with some embodiments of the present disclosure.

Each SRAM bit cell 104 includes two inverters cross-coupled together to store a bit of data and further includes a pass gate electrically connected to the two inverters for reading from and write into the SRAM bit cell. The SRAM bit cell 104 is further illustrated in FIG. 2 in a schematic view, constructed in accordance with some embodiments. FIG. 2 has been simplified for the sake of clarity to better understand the inventive concepts of the present disclosure. Additional features can be added in SRAM bit cell 104, and some of the features described below can be replaced, modified, or eliminated in other embodiments of the SRAM bit cell 104.

The SRAM bit cell 104 includes six transistors: a pass-gate transistor PG-1, a pass-gate transistor PG-2, a pull-up transistor PU-1, a pull-up transistor PU-2, a pull-down transistor PD-1, and a pull-down transistor PD-2. SRAM cell 100 is thus referred to as a 6-transistor (6-T) SRAM cell. The 6-T SRAM cell is used for illustration and to explain the features, but does not limit the embodiments or the appended claims. This non-limiting embodiment may be further extended to an 8-T SRAM cell, a 10-T SRAM cell, and to content addressable memory (CAM) cells. In operation, the pass-gate transistors PG-1, PG-2 provide access to a storage portion of the SRAM bit cell 104, which includes a cross-coupled pair of inverters, a first inverter INV1 and a second inverter INV2. The first inverter INV1 includes the pull-up transistor PU-1 and the pull-down transistor PD-1, and the second inverter INV2 includes the pull-up transistor PU-2 and the pull-down transistor PD-2.

A gate of the pull-up transistor PU-1 interposes a source (electrically coupled with a higher power line Vdd) and a first common drain (CD1), and a gate of the pull-down transistor PD-1 interposes a source (electrically coupled with a lower power line Vss) and the first common drain (CD1). A gate of the pull-up transistor PU-2 interposes a source (electrically coupled with the higher power line Vdd) and a second common drain (CD2), and a gate of the pull-down transistor PD-2 interposes a source (electrically coupled with the lower power line Vss) and the second common drain (CD2). In some implementations, the first common drain (CD1) is a storage node (SN) that stores data in true form, and the second common drain (CD2) is a storage node (SNB) that stores data in complementary form. The gate of the pull-up transistor PU-1 and the gate of the pull-down transistor PD-1 are coupled with the second common drain (CD2), and the gate of the pull-up transistor PU-2 and the gate of the pull-down transistor PD-2 are coupled with the first common drain (CD1). A gate of the pass-gate transistor PG-1 interposes a source (electrically coupled with a bit line BL) and a drain, which is electrically coupled with the first common drain (CD1). A gate of the pass-gate transistor PG-2 interposes a source (electrically coupled with a complementary bit line BLB) and a drain, which is electrically coupled with the second common drain (CD2). The gates of the pass-gate transistors PG-1, PG-2 are electrically coupled with a word line WL. In some implementations, pass-gate transistors PG-1, PG-2 provide access to storage nodes SN, SNB during read operations and/or write operations. For example, the pass-gate transistors PG-1, PG-2 couple storage nodes SN, SNB respectively to bit lines BL, BLB in response to voltage applied to the gates of pass-gate transistors PG-1, PG-2 by the word lines WLs.

When the SRAM bit cell 104 is read from, a positive voltage is placed on the word line WL, and the pass gate transistors PG-1 and PG-2 allow the bit lines BL and BLB to be coupled to, and receive the data from, the storage nodes SN and SNB. Unlike a dynamic memory or DRAM cell, a SRAM cell does not lose its stored state during a read, so no data "write back" operation is required after a read. The bit lines BL and BLB form a complementary pair of data lines. As is known to those skilled in the art, these paired data lines may be coupled to a differential sense amplifier (not shown); and the differential voltage read from SRAM bit cells can be sensed and amplified. The amplified sensed signal, which is at a logic level voltage, may then be output as read data to other logic circuitry in the device.

In some embodiments, the pull-up transistors PU-1, PU-2 are configured as p-type field-effect transistors (PFETs), and the pull-down transistors PD-1, PD-2 are configured as n-type filed-effect transistors (NFETs). In some implementations, the pass-gate transistors PG-1, PG-2 are also configured as NFETs. Various NFETs and PFETs may be formed by any proper technology, such as fin-like FETs (FinFETs) that includes n-type FinFETs and p-type FinFETs. In one embodiment, the various n-type FinFETs and p-type FinFETs are formed by a process including etching a semiconductor to form trenches, partially filling (such as by a procedure that includes deposition, chemical mechanical polishing and etching to recess) the trenches to form shallow trench isolation (STI) features and fin active regions. In furtherance of the present embodiment, an epitaxy semiconductor layer is selectively formed on the fin active region. In another embodiment, the various FinFETs are formed by a process including depositing a dielectric material layer on the semiconductor substrate, etching the dielectric material layer to form openings thereof, selective epitaxy growing a semiconductor material (such as silicon) on the semiconductor substrate within the openings to form fin active regions and STI features. In another embodiment, the various FinFETs may include strained features for enhanced mobility and device performance. For example, the p-type FinFETs may include epitaxy grown silicon germanium on a silicon substrate. The n-type FinFETs may include epitaxy grown silicon carbide on the silicon substrate. In another embodiment, the gate stacks in various FinFETs are formed using high k/metal gate technology, in which the gate dielectric layer includes high-k dielectric material and the gate electrode includes metal.

Figure 3:
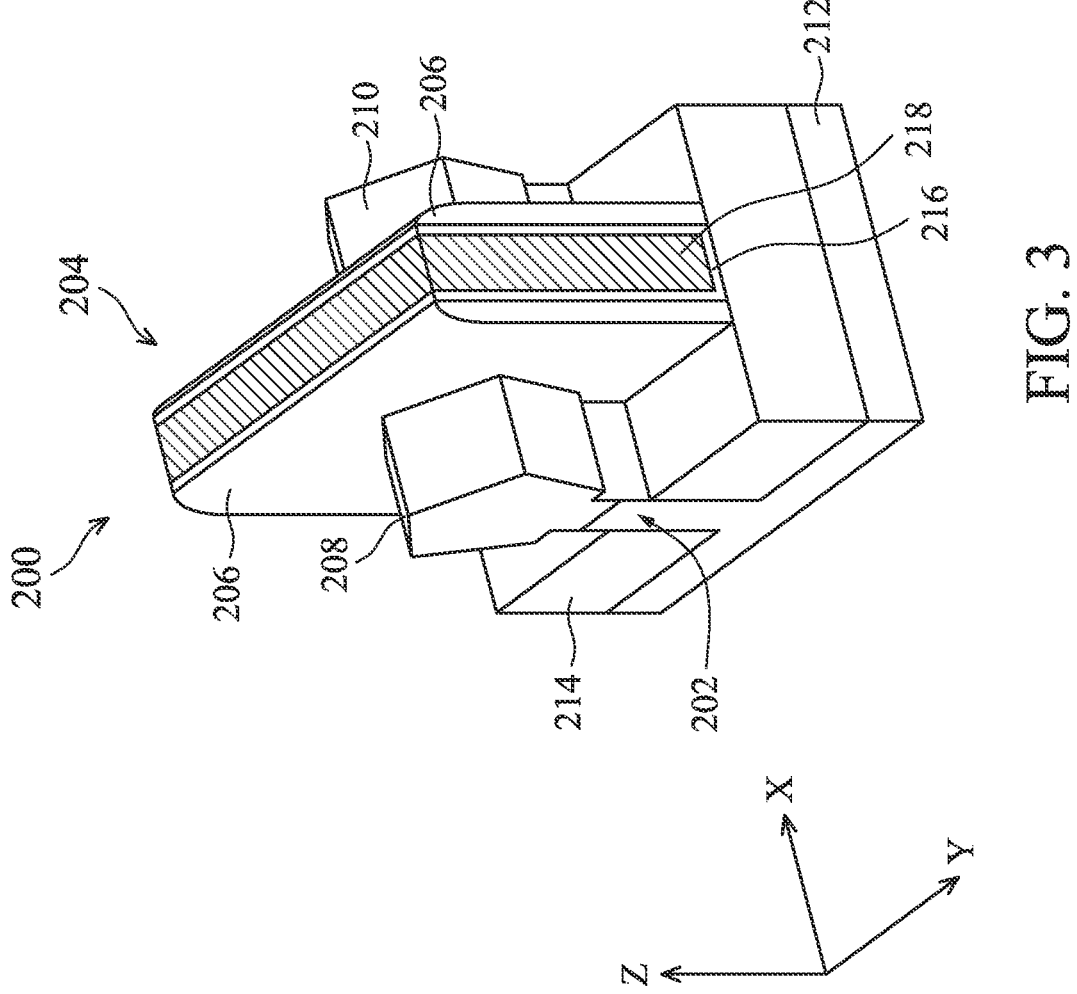
FIG. 3 is a perspective view of a multi-gate transistor, in accordance with some embodiments of the present disclosure.
Figure 4:
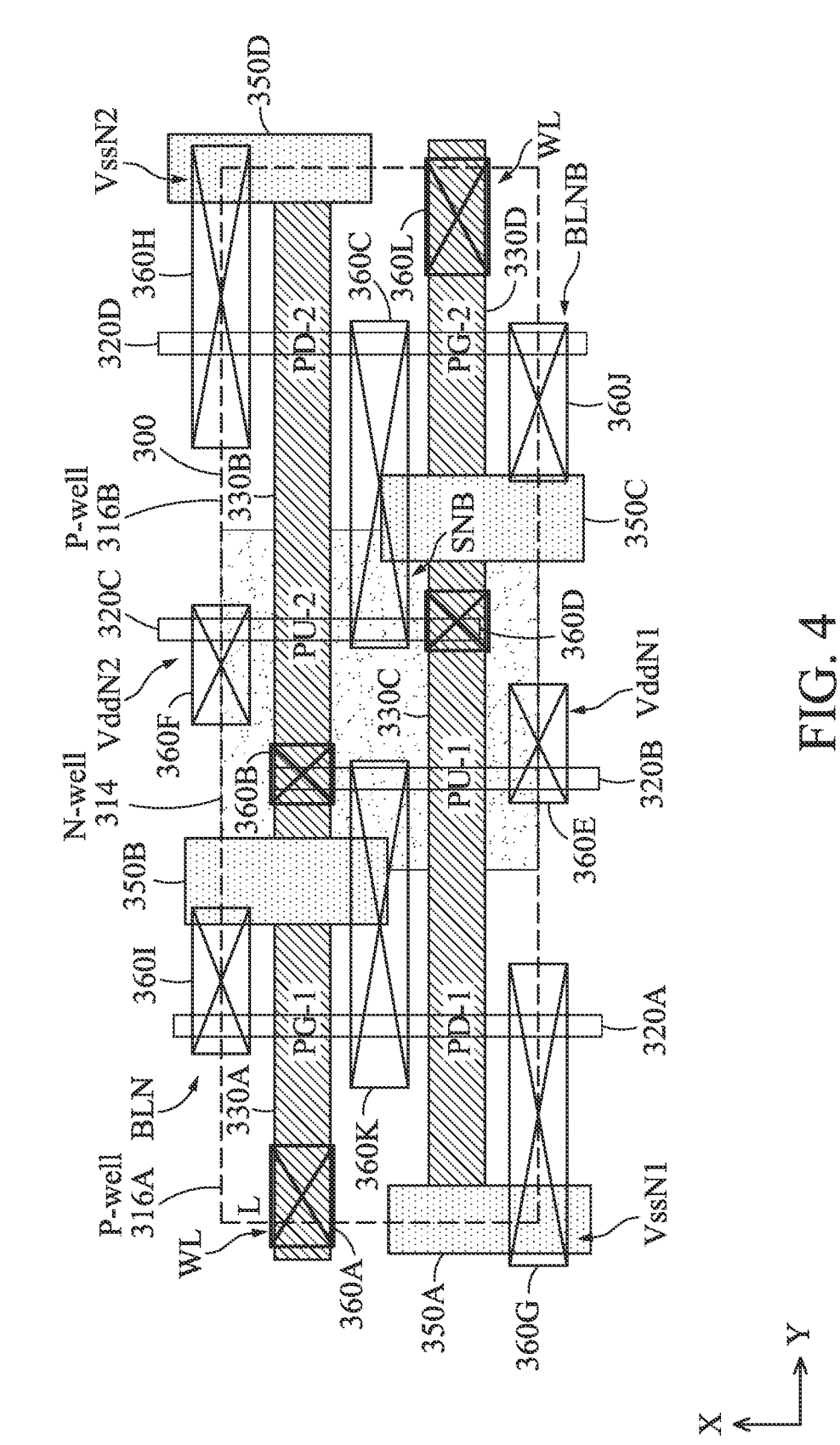
FIG. 4 is a layout of an SRAM bit cell in the integrated circuit of FIG. 1, in accordance with some embodiments of the present disclosure.

FIG. 3 illustrates a perspective view of a fin-based multi-gate transistor 200 relating to an embodiment of the present disclosure, which can be employed to implement any of the transistors in the SRAM bit cell 104 shown in FIG. 2, including the pull-up transistor PU-1, pull-up transistor PU-2, pull-down transistor PD-1, pull-down transistor PD-2, pass-gate transistor PG-1, and pass-gate transistor PG-2. A typical multi-gate transistor is fabricated with a thin fin-like structure that provides an active region of the transistor. The fin-like structure provides an active region for multi-gate transistor 200. In some embodiments, the fin-like structure is a continuous fin protruding from a substrate as an active region and fin-based multi-gate transistor 200 is referred to as a Fin field-effect transistor (FinFET). In some embodiments, the fin-like structure includes vertically stacked horizontally-oriented nanostructures (e.g., nanowires or nanosheets) as an active region and fin-based multi-gate transistor 200 is a gate-all-around (GAA) transistor. In the present disclosure, the fin-like structure is termed as a "fin." The term "fin" as used herein refers to either a continuous fin in a FinFET or a stack of nanostructures (e.g., nanowires or nanosheets) forming a fin-like shape in a GAA transistor. In the illustrated embodiment, fin-based multi-gate transistor 200 includes a fin 202, a gate structure 204, gate spacers 206, a drain region 208, and a source region 210. For example, the fin 202 represents any of the fins 320A, 320B, 320C, 320D in a layout 300 of the SRAM bit cell 104 as shown in FIG. 4.

The fin 202 extends above a semiconductor substrate 212. In some embodiments, the semiconductor substrate 212 and the fin 202 are made of the same material. For example, the substrate is a silicon substrate. In some instances, the substrate includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, the substrate is a silicon on insulator (SOI) layer substrate or a silicon on sapphire (SOS) substrate. In some embodiments, the semiconductor substrate 212 and the fin 202 are made of different materials.

The fin 202 may be patterned by any suitable method. For example, the fin 202 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin 202.

In some embodiments, the fin 202 may be surrounded by an isolating feature 214 formed on opposite sides of the fin 202. The isolating feature 214 may electrically isolate an active region of the fin-based multi-gate transistor 200 from other active regions. In some embodiments, the isolating feature 214 are a shallow trench isolation (STI) feature, field oxide (FOX), or another suitable electrically insulating structure.

Still referring to FIG. 3, in some embodiments, the gate structure 204 includes a gate dielectric 216 and a gate electrode 218 formed over the gate dielectric 216. In a FinFET, the gate structure 204 is positioned over sidewalls and a top surface of the fin 202. In a GAA transistor, the gate structure 204 wraps around each of the staked nanostructures (e.g., nanowire or nanosheet) in the fin-like structure. Therefore, a portion of the fin 202 overlaps the gate structure 204 may serve as a channel region. In some embodiments, the gate dielectric 216 is a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate electrode 218 is made of a conductive material, such as aluminum (Al), copper (Cu), tungsten (W), titanium (Ti), tantalum (Ta), or another applicable material. In some embodiments, gate spacers 206 are deposited on sidewalls of the gate structure 204. In some embodiments, the gate spacers 206 are made of silicon nitride, silicon oxynitride, silicon carbide, another suitable material, or a combination thereof.

In some embodiments, portions of the fin 202 that are not covered by the gate structure 204 and the gate spacers 206 serve as a drain region 208 and a source region 210. In some embodiments, the drain region 208 and the source region 210 of a PFET, for example, the pull-up transistor PU-1 and the pull-up transistor PU-2, are formed by implanting the portions of the fin 202 that are not covered by the gate structure 204 and the gate spacers 206 with a p-type impurity such as boron, indium, or the like. In some embodiments, the drain region 208 and the source region 210 of an NFET, for example, the pass-gate transistor PG-1, the pass-gate transistor PG-2, the pull-down transistor PD-1, and the pull-down transistor PD-2, are formed by implanting the portions of the fin 202 that are not covered by the gate structure 204 and the gate spacers 206 with an n-type impurity such as phosphorous, arsenic, antimony, or the like.

In some embodiments, the drain region 208 and the source region 210 are formed by etching portions of fin 202 that are not covered by the gate structure 204 and the gate spacers 206 to form recesses, and growing epitaxial regions in the recesses. The epitaxial regions may be formed of Si, Ge, SiP, SiC, SiPC, SiGe, SiAs, InAs, InGaAs, InSb, GaAs, GaSb, InAlP, InP, C, or a combination thereof. Accordingly, the drain region 208 and the source region 210 may be formed of silicon germanium (SiGe) in some exemplary embodiments, while the remaining fin 202 may be formed of silicon. In some embodiments, p-type impurities are in-situ doped in the drain region 208 and the source region 210 during the epitaxial growth of the drain region 208 and the source region 210 of a PFET, for example, the pull-up transistor PU-1 and the pull-up transistor PU-2. In addition, n-type impurities are in-situ doped in the drain region 208 and the source region 210 during the epitaxial growth of the drain region 208 and the source region 210 of an NFET, for example, the pass-gate transistor PG-1, the pass-gat transistor PG-2, the pull-down transistor PD-1, and the pull-down transistor PD-2 in FIG. 2.

In some alternative embodiments, the pass-gate transistors PG-1, PG-2, the pull-up transistors PU-1, PU-2, and the pull-down transistors PD-1, PD-2 of the SRAM bit cell 104 in FIG. 2 are planar MOS devices.

FIG. 4 illustrates a layout 300 of the SRAM bit cell 104 (represented by the dashed box), of which the circuit diagram is shown in FIG. 2, according to various aspects of the present disclosure. FIG. 4 has been simplified for the sake of clarity to better understand the inventive concepts of the present disclosure. For example, for convenience of illustration, the simplified layout 300 shown in FIG. 4 illustrates, among other features, a layout of wells, fins, gate structures, source/drain (S/D) contacts formed on source/drain regions, gate contacts formed on gate structures, and gate isolation features in cut-metal-gate (CMG) trenches that "cut" an otherwise continuous gate structure into multiple segments. Source/drain region(s) may refer to a source or a drain, individually or collectively dependent upon the context. One of ordinary skill in the art should also understand that for the purpose of illustration, FIG. 4 only shows one exemplary configuration of a layout of a 6-T SRAM bit cell. Additional features can be added in the layout 300, and some of the features described below can be replaced, modified, or eliminated corresponding to other embodiments of the SRAM bit cell 104.

Still referring to FIG. 4, the SRAM bit cell 104 includes six transistors: a pass-gate transistor PG-1, a pass-gate transistor PG-2, a pull-up transistor PU-1, a pull-up transistor PU-2, a pull-down transistor PD-1, and a pull-down transistor PD-1. The layout 300 thus represents a layout of a 6-T SRAM cell. The SRAM bit cell 104 includes a region 314 that provides an n-well between a region 316A and a region 316B that each provides a p-well (collectively as region 316). The pull-up transistors PU-1, PU-2 are disposed over the region 314; the pull-down transistor PD-1 and the pass-gate transistor PG-1 are disposed over the region 316A; and the pull-down transistor PD-2 and the pass-gate transistor PG-2 are disposed over the region 316B. In some implementations, the pull-up transistors PU-1, PU-2 are configured as PFETs, and the pull-down transistors PD-1, PD-2 and the pass-gate transistors PG-1, PG-2 are configured as NFETs. In some embodiments, each transistor may be in a form similar to the fin-based multi-gate transistor 200 as shown in FIG. 3.

Each of the transistors PG-1, PG-2, PU-1, PU-2, PD-1, and PD-2 includes an active region. In some embodiments, an active region includes a fin. In the illustrated embodiment, the SRAM bit cell 104 includes a fin 320A, a fin 320B, a fin 320C, and a fin 320D (collectively, as the fins 320) disposed over a semiconductor substrate. The fins 320 are extending lengthwise in the X-direction and oriented substantially parallel to one another. In some implementations, the fins 320 are a portion of the semiconductor substrate (such as a portion of a material layer of the semiconductor substrate). For example, where the semiconductor substrate includes silicon, the fins 320 include silicon and project upwardly and continuously from the semiconductor substrate. Alternatively, in some implementations, the fins 320 are defined in one or more semiconductor material layers, overlying the semiconductor substrate. For example, the fins 320 can include a stack of nanostructures (nanowires or nanosheets) vertically stacked over the semiconductor substrate.

Various gate structures are disposed over the fins 320, such as a gate structure 330A, a gate structure 330B, a gate structure 330C, and a gate structure 330D (collectively, as the gate structures 330, or gate stacks 330). The gate structures 330 extend lengthwise along the Y-direction (for example, substantially perpendicular to the fins 320). The gate structures 330 wrap at least portions of the fins 320, positioned such that the gate structures interpose respective source/drain regions of the fins 320. The gate structure 330A is disposed over the fin 320A; the gate structure 330C is disposed over the fins 320A, 320B, 320C; the gate structure 330B is disposed over the fins 320B, 320C, 320D; and the gate structure 330D is disposed over the fin 320D. A gate of the pass-gate transistor PG-1 is formed from the gate structure 330A, a gate of the pull-down transistor PD-1 is formed from the gate structure 330C, a gate of the pull-up transistor PU-1 is formed from the gate structure 330C, a gate of the pull-up transistor PU-2 is formed from the gate structure 330B, a gate of the pull-down transistor PD-2 is formed from the gate structure 330B, and a gate of the pass-gate transistor PG-2 is formed from the gate structure 330D.

In the illustrated embodiment, each of the transistors is formed at a cross-section of the respective gate structure and a single fin. Alternatively, some of the transistors may be formed at cross-sections of the respective gate structure and multiple fins. For example, the pull-down transistor PD-1 and the pass-gate transistor PG-1 each may be a multi-fin FET (including, for example, the fin 320A and an extra fin disposed on the region 316A (not shown in FIG. 4)), the pull-up transistor PU-1 is a single-fin FET (including, for example, the fin 320B), the pull-up transistor PU-2 is a single-fin FinFET (including, for example, the fin 320C), and the pull-down transistor PD-2 and pass-gate transistor PG-2 each may be a multi-fin FET (including, for example, the fin 320D and an extra fin disposed on the region 316B (not shown in FIG. 4)).

A gate contact 360A electrically connects a gate of the pass-gate transistor PG-1 (formed by gate structure 330A) to a word line WL (generally referred to as a word line node WL), and a gate contact 360L electrically connects a gate of the pass-gate transistor PG-2 (formed by gate structure 330D) to the word line. An S/D contact 360K electrically connects a drain region of the pull-down transistor PD-1 (formed on the fin 320A (which may include n-type epitaxial source/drain features)) and a drain region of the pull-up transistor PU-1 (formed on the fin 320B (which may include p-type epitaxial source/drain features)), such that a common drain of pull-down transistor PD-1 and pull-up transistor PU-1 form a storage node SN. A gate contact 360B electrically connects a gate of the pull-up transistor PU-2 (formed by gate structure 330B) and a gate of the pull-down transistor PD-2 (also formed by gate structure 330B) to the storage node SN. An S/D contact 360C electrically connects a drain region of the pull-down transistor PD-2 (formed on the fin 320D (which may include n-type epitaxial source/drain features)) and a drain region of the pull-up transistor PU-2 (formed on the fin 320C (which may include p-type epitaxial source/drain features)), such that a common drain of pull-down transistor PD-2 and pull-up transistor PU-2 form a storage node SNB. A gate contact 360D electrically connects a gate of the pull-up transistor PU-1 (formed by the gate structure 330C) and a gate of the pull-down transistor PD-1 (also formed by the gate structure 330C) to the storage node SNB.

An S/D contact 360E electrically connects a source region of pull-up transistor PU-1 (formed on the fin 320B (which can include p-type epitaxial source/drain features)) to a power supply voltage Vdd at a voltage node VddN1, and an S/D contact 360F electrically connects a source region of the pull-up transistor PU-2 (formed on the fin 320C (which may include p-type epitaxial source/drain features)) to the power supply voltage Vdd at a voltage node VDDN2. An S/D contact 360G electrically connects a source region of the pull-down transistor PD-1 (formed on the fin 320A (which may include n-type epitaxial source/drain features)) to a grounding voltage Vss at a voltage node VssN1, and an S/D contact 360H electrically connects a source region of the pull-down transistor PD-2 (formed on the fin 320D (which may include n-type epitaxial source/drain features)) to the grounding voltage Vss at a voltage node VssN2. The S/D contact 360G and the S/D contact 360H may be device-level contacts that are shared by adjacent SRAM bit cells 104 (e.g., four SRAM bit cells 104 abutting at a same corner may share one S/D contact 360G). A S/D contact 360I electrically connects a source region of the pass-gate transistor PG-1 (formed on the fin 320A (which may include n-type epitaxial source/drain features)) to a bit line BL (generally referred to as a bit line node BLN), and an S/D contact 360J electrically connects a source region of the pass-gate transistor PG-2 (formed on the fin 320D (which may include n-type epitaxial source/drain features)) to a complementary bit line BLB (generally referred to as a bit line node BLNB).

Still referring to FIG. 4, the SRAM bit cell 104 further includes a plurality of dielectric features extending length-wise along the X-direction, including a dielectric feature 350A, a dielectric feature 350B, a dielectric feature 350C, and a dielectric feature 350D (collectively, dielectric features 350 or referred to as isolation features 350). In the illustrated embodiment, the dielectric feature 350B is disposed between the fin 320A and the fin 320B and abuts the gate structure 330A and the gate structure 330B. The dielectric feature 350B divides an otherwise continuous gate structure into two isolated segments corresponding to the gate structure 330A and the gate structure 330B. The dielectric feature 350C is disposed between the fin 320C and the fin 320D and abuts the gate structure 330C and the gate structure 330D. The dielectric feature 350C divides an otherwise continuous gate structure into two isolated segments corresponding to the gate structure 330C and the gate structure 330D. The dielectric feature 350A is disposed near an edge of the SRAM bit cell 104 and abuts the gate structure 330C. The dielectric feature 350A divides the gate structure 330C from adjoining other gate structure from an adjacent SRAM bit cell. The dielectric feature 350D is disposed near another edge of the SRAM bit cell 104 and abuts the gate structure 330B. The dielectric feature 350D divides gate structure 330B from adjoining other gate structure from an adjacent SRAM bit cell. Each of the dielectric features 350 is formed by filling a corresponding CMG trench in the position of the dielectric features. The dielectric features 350 are also referred to as CMG features.

In the illustrated embodiment, from a top view, the CMG feature 350B is disposed above an interface between the n-well region 314 and the p-well region 316A, the CMG feature 350C is disposed above an interface between the n-well region 314 and the p-well region 316B, the CMG feature 350A is disposed completely above a p-well region that includes the p-well region 316A, and the CMG feature 350D is disposed completely above a p-well region that includes the p-well region 316B.

Figure 5:
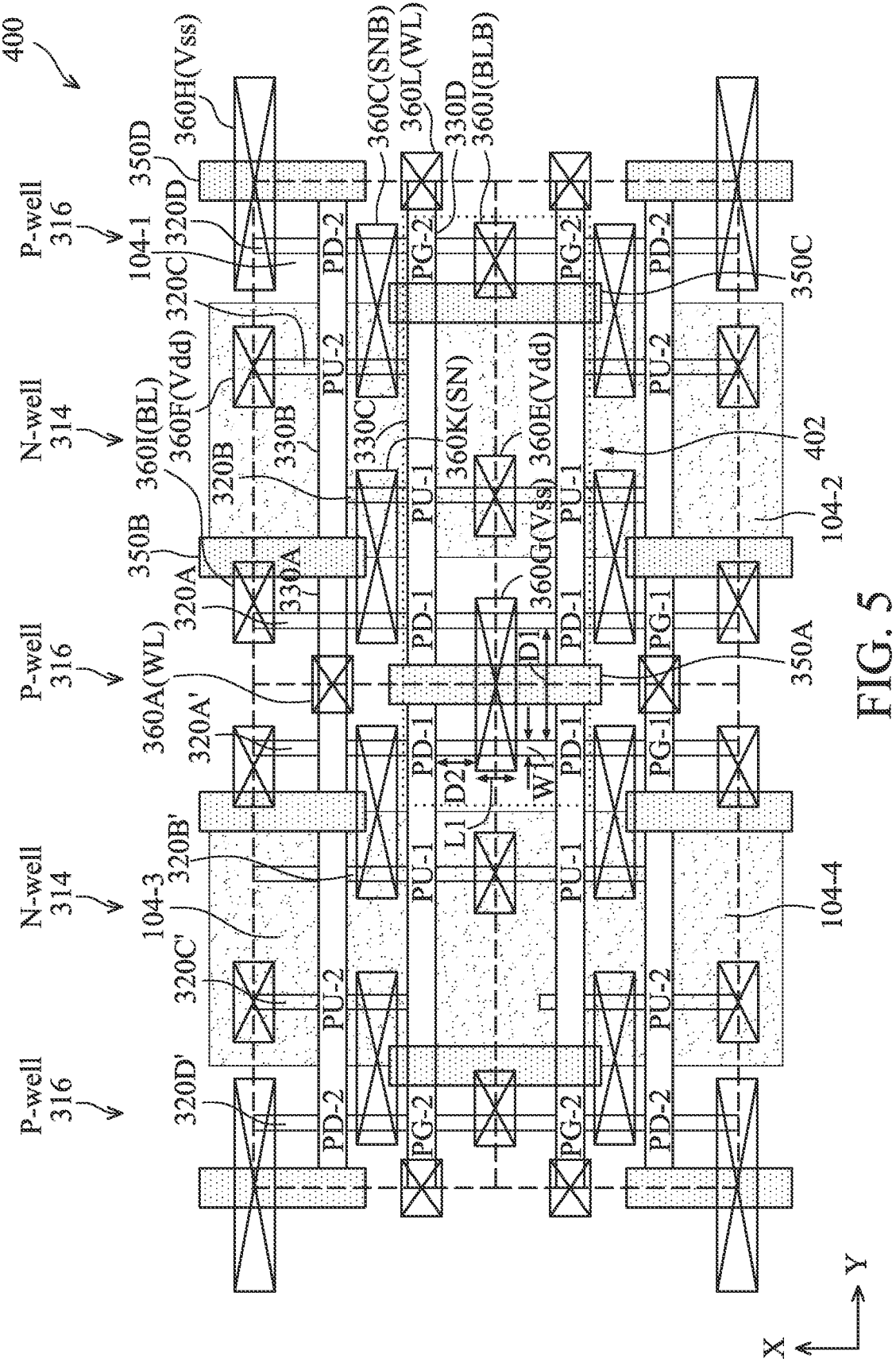
FIG. 5 is a layout of a 2×2 memory array tiled by the SRAM bit cell of FIG. 4, in accordance with some embodiments of the present disclosure.

FIG. 5 illustrates a layout 400 of an array of SRAM bit cells according to the present disclosure. Referring to FIG. 5, a plurality of SRAM bit cells 104-1, 104-2, 104-3, and 104-4 are arranged in the X-direction and the Y-direction, forming a 2×2 array of SRAM bit cells. Each SRAM bit cell in the array may use the layout 300 of the SRAM bit cell 104 as depicted in FIG. 4. In some embodiments, two adjacent SRAM bit cells in the X-direction are line symmetric with respect to a common boundary (represented by dotted lines in FIG. 5) therebetween and two adjacent SRAM cells in the Y-direction are line symmetric with respect to a common boundary therebetween. That is, the SRAM bit cell 104-2 is a duplicate cell for the SRAM bit cell 104-1 but flipped over the Y-axis; the SRAM bit cell 104-3 is a duplicate cell for the SRAM bit cell 104-1 but flipped over the X-axis; and the SRAM bit cell 104-4 is a duplicate cell for the SRAM bit cell 104-2 but flipped over the X-axis. FIG. 5 has been simplified for the sake of clarity to better understand the inventive concepts of the present disclosure. For example, the gate contacts 360B, 360D in a SRAM cell 104 as depicted in FIG. 4 are omitted. Also, reference numerals in FIG. 4 are repeated in FIG. 5 for ease of understanding, such as the fins 320A-320D, the gate structures 330A-330D, and the CMG features 350A-350D.

The example 2×2 array includes regions 314 and 316. In the present embodiment, the regions 316 provides p-wells for forming NFETs (including transistors PG-1, PD-1, PG-2, and PD-2) and the regions 314 provides n-wells for forming PFETs (including transistors PU-1 and PU-2). Therefore, the region 316 is also referred to as the NFET region 316, and region 314 is also referred to as the PFET region 314.

The example 2×2 array includes regions 314 and 316 alternately arranged along the Y-axis. In other words, every PFET region 314 is next to an NFET region 316 which is next to another PFET region 314, and this pattern repeats. For ease of reference, a column is referred to as being in the X-direction in this example. Thus, the SRAM bit cells 104-1, 104-2 are in a first column, and the SRAM bit cells 104-3, 104-4 are in a second column. As depicted above, adjacent cells in the array are mirror images along a common boundary between the adjacent cells. Some active regions in an SRAM bit cell may extend through multiple SRAM bit cells in a column. In FIG. 5, the active region (i.e., fin 320A) for the transistors PG-1 and PD-1 in the SRAM bit cell 104-1 extends through the SRAM bit cell 104-2 as the active region for its transistors PD-1 and PG-1. The active region (i.e., fin 320B) for the transistor PU-1 in the SRAM bit cell 104-1 extends into the SRAM bit cell 104-2 as the active region for its transistor PU-1. Similarly, the active region (i.e., fin 320D) for the transistors PG-2 and PD-2 in the SRAM bit cell 104-1 extends through the SRAM bit cell 104-2 as the active region for its transistors PD-2 and PG-2. The active regions (denoted as fins 320A'-320D') in the SRAM bit cells 104-3, 104-4 are similarly arranged as their counterparts 320A-320D.

By having the SRAM bit cells in the configuration in FIG. 5, active regions can uniformly extend throughout an array of SRAM bit cells. For example, spacing between active regions in the Y-direction can be uniform. This configuration can improve the uniformity of an array layout. In a top view as shown in FIG. 5, the fins 320 has a critical dimension (CD, also referred to as width W1 along the Y-direction) and an edge-to-edge distance D1 to an adjacent fin. With the scaling down of process nodes, in a semiconductor device, a CD in a memory region may be about 40% to about 80% of a CD in a logic region. Similarly, gate structures can uniformly extend throughout an array of SRAM cells. For example, spacing between gate structures in the X-direction can be uniform. Further, some gate structures can extend longitudinally across multiple SRAM cells without being interrupted by an isolation feature. Some gate structures are divided into segments by dielectric features, such as the CMG features 350A-350D, which fill up CMG trenches formed by a CMG process. The CMG features disposed at boundaries of the SRAM bit cells can also be shared by adjacent SRAM bit cells. In the illustrated embodiment, the CMG feature 350A extends into corner regions of the four SRAM bit cells 104-1, 104-2, 104-3, 104-4 and is shared by these four SRAM bit cells. Similarly, the CMG feature 350D is shared by four respective neighboring SRAM bit cells. The CMG feature 350C extends longitudinally across the boundary between the SRAM bit cells 104-1 and 104-2 and is shared by these two SRAM bit cells. Similarly, the CMG feature 350B is share by two respective neighboring SRAM bit cells. The contacts 360 disposed at boundaries of the SRAM bit cells can also be shared by adjacent SRAM bit cells. In the illustrated embodiment, the S/D contact 360G extends into corners regions of the four SRAM bit cells 104-1, 104-2, 104-3, 104-4 and is shared by these four SRAM bit cells, therefore tying the Vss nodes of the four SRAM bit cells together. The S/D contact 360G has a width L1 along the X-direction and an edge-to-edge distance D2 to an adjacent gate structure 330. The distance D2 may be a minimum distance that avoids metal gate protrusion during the contact feature formation. Metal gate protrusion may cause shorting between a gate structure and a metal contact that is too close to the gate structure. Similarly, the S/D contact 360H is shared by four respective neighboring SRAM bit cells. The S/D contacts 360E, 360J, 360F, 360I is shared by two respective SRAM bit cells. The gate contact 360A extends longitudinally across the boundary between the SRAM bit cells 104-1 and 104-2 and is shared by these two SRAM bit cells. Similarly, the gate contact 360L is shared by two respective SRAM bit cells.

Still referring to FIG. 5, the sources of the PU-1 and PU-2 are connected to a first power line Vdd with a higher voltage; the sources of the PD-1 and PD-2 are connected to a second power line Vss with a lower voltage (e.g., a grounding line); the drains of the PG-1 and PG-2 are connected to a bit-line (BL) and a complimentary bit-line (BLB), respectively; and the gates of the PG-1 and PG-2 are connected to a word-line (WL). In the illustrated embodiment, each SRAM bit cell 104 includes a first Vss and a second Vss, each of which is shared with four adjacent SRAM bit cells. Similarly, each SRAM bit cell 104 includes a first Vdd and a second Vdd, each of which is shared with two adjacent SRAM bit cells along the X-direction. Each SRAM bit cell 104 includes a BL and a BLB, each of which is shared with two adjacent SRAM bit cells along the X-direction. Each SRAM bit cell 104 includes a first WL and a second WL, each of which is shared with two adjacent SRAM bit cells along the Y-direction.

Figure 6A:
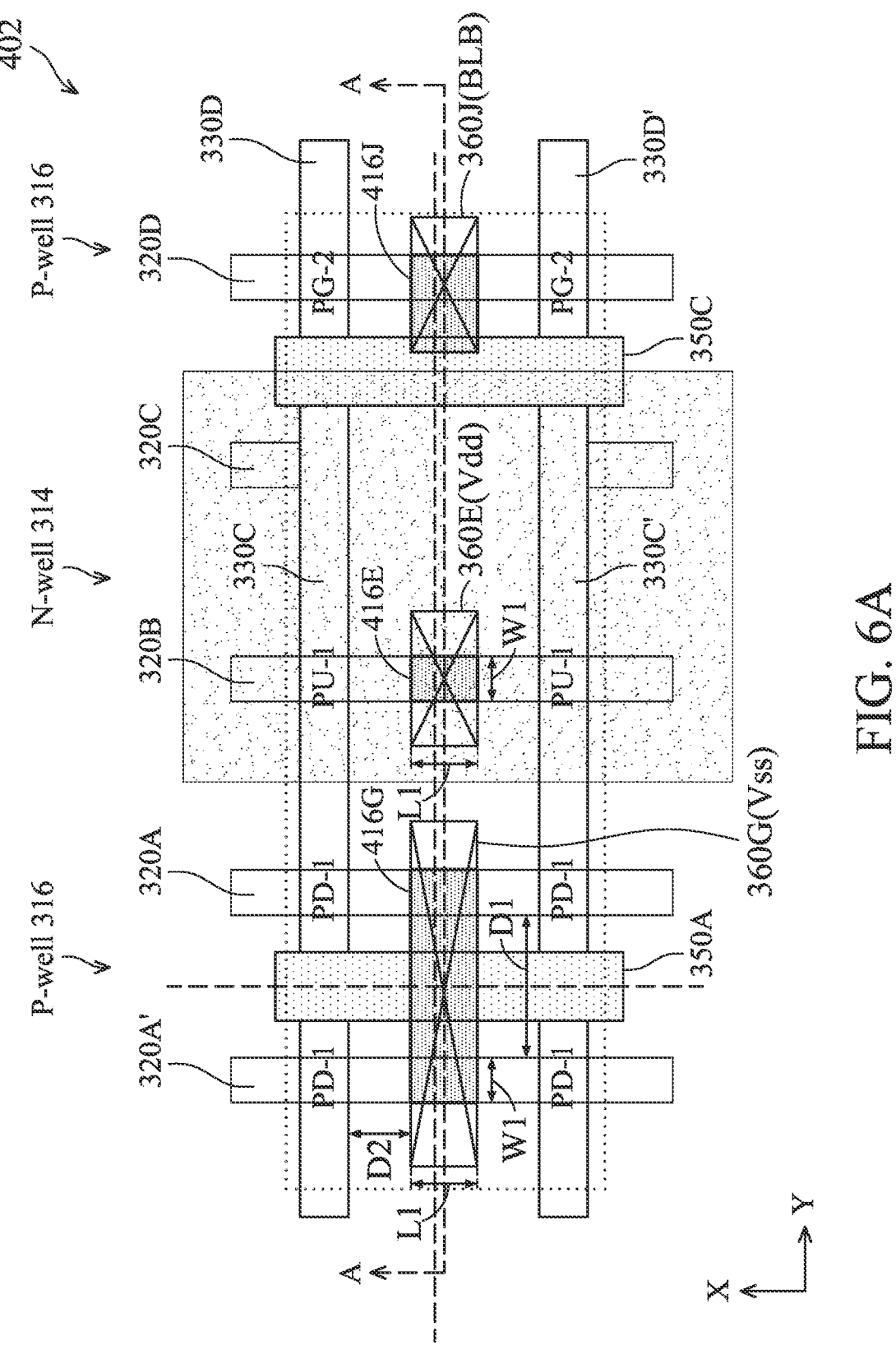
FIGS. 6A and 6B are top and cross-sectional views of a region of the memory array of FIG. 5, respectively, in accordance with some embodiments of the present disclosure.
Figure 6B:
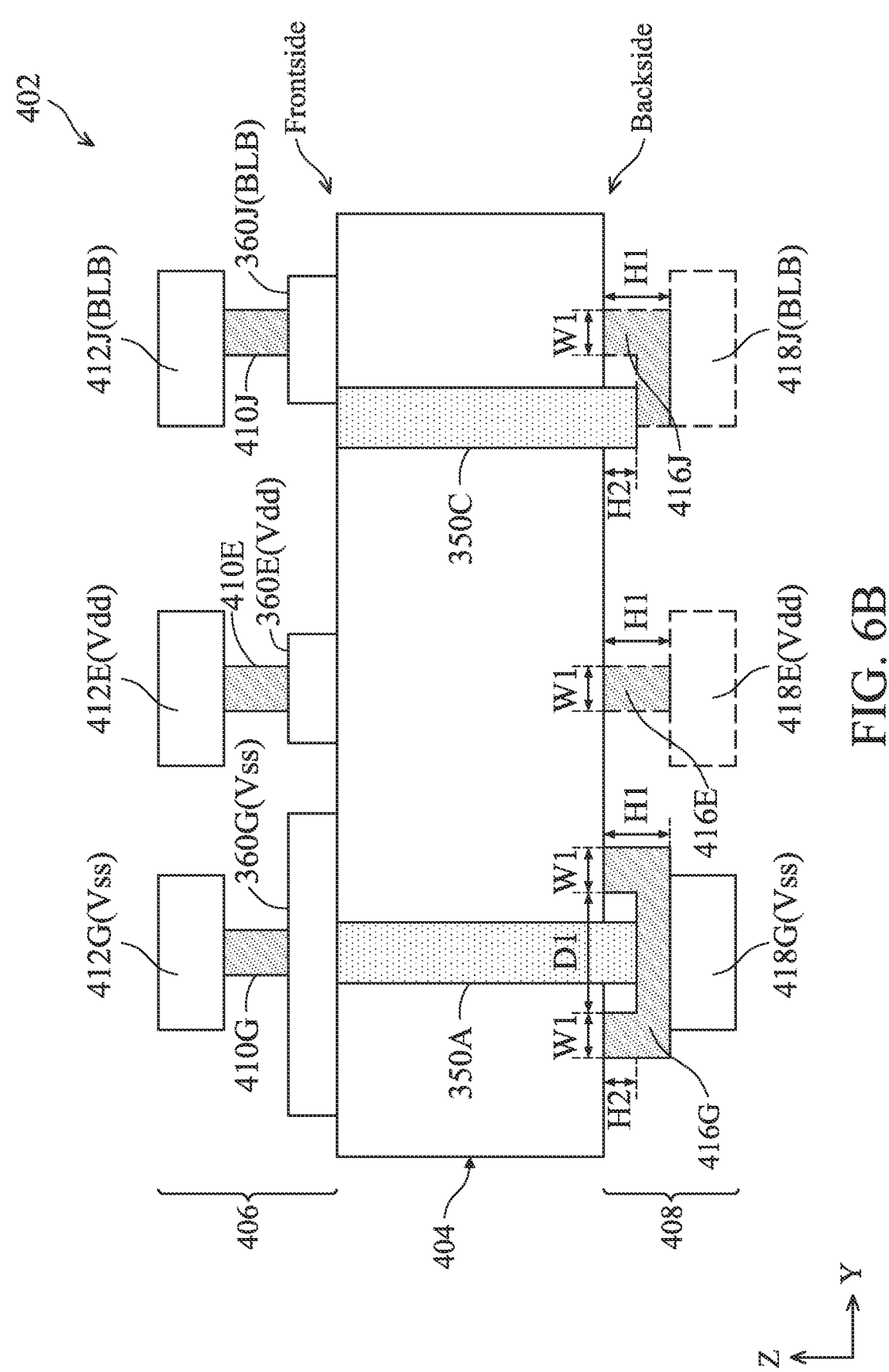

FIGS. 6A and 6B illustrate a top view of a region 402 in FIG. 5 represented in a dotted box and corresponding cross-section view along A-A line in the region 402, respectively. The region 402 includes portions of the fins 320A, 320B, 320C, 320D, and 320A' as a mirrored reflection of the fin 320A in an adjacent SRAM bit cell. The region 402 also includes, among other features, the CMG features 350A, 350C, the S/D contact 360E (coupled to a first power line Vdd with a higher voltage), the S/D contact 360G (coupled to a second power line Vss with a lower voltage, e.g., a grounding line), and the S/D contact 360J (coupled to complimentary bit line BLB).

Those power lines (Vdd and Vss) and signal lines (WL, BL, BLB) are not all formed on the frontside of the integrated circuit structure 100 but are distributed on both the frontside and backside of the integrated circuit structure 100. Especially, the integrated circuit structure 100 includes a frontside interconnect structure and a backside interconnect structure disposed on the frontside and backside of the integrated circuit structure 100 respectively and configured to connect various components of the pull-up devices, pull-down devices, and pass-gate devices to form the SRAM bit cells 104. The configuration is designed with considerations of various factors and parameters, including sizes of various conductive features, packing density, resistance of the conductive features, parasitic capacitances among adjacent conductive features, overlay shifting and processing margins. For example, if conductive features are too close, overlay shift may lead to short and leakage issues; the sizes of the conductive features are reduced, leading to increased resistances; the parasitic capacitances are increased as well; the processing margins are reduced; and so on. If the sizes of the conductive features are increased, the resistances of the conductive features are reduced but the spacing between the adjacent conductive features are decreased, leading to the increased parasitic capacitances, and reduced processing margins. If shielding conductive features are placed among adjacent conductive features, the parasitic capacitances are reduced. However, the packing density is reduced, and/or the resistances of the conductive features are increased.

In the depicted embodiment, the grounding line Vss is formed on the frontside and the backside, the power line Vdd is formed on the frontside and optionally (represented by the dashed boxes in FIG. 6B) on the backside, and one of the signal lines (e.g., BLB) is formed on the frontside and optionally (represented by the dashed boxes in FIG. 6B) on the backside. That is, in one embodiment, the grounding line Vss is formed on the frontside and the backside, and the power line Vdd and the signal line BLB are formed on the frontside only; in another embodiment, the grounding line Vss and the power line Vdd are formed on the frontside and the backside, and the signal line BLB is formed on the frontside only; in yet another embodiment, the grounding line Vss and the signal line BLB is formed on the frontside and the backside, and the power line Vdd is formed on the frontside only; in yet another embodiment, the grounding line Vss, the power line Vdd, and the signal line BLB are formed on the frontside and the backside.

As shown in FIG. 6B, the integrated circuit structure 100 includes a substrate 404 with various devices (e.g., pull-up devices, pull-down devices, and pass-gate devices) of the SRAM bit cells 104 formed thereon. The integrated circuit structure 100 further includes a frontside interconnect structure 406 formed on the frontside of the substrate 404 and a backside interconnect structure 408 formed on the backside of the substrate 404. The frontside interconnect structure 406 may include contacts (or contact features) 360 (e.g., S/D contacts 360G, 360E, 360J), vias (or vias features) 410 (e.g., vias 410G, 410E, 410J landing on S/D contacts 360G, 360E, 360J, respectively), and metal lines 412 (e.g., metal lines 412G, 412E, 412J landing on the vias 410G, 410E, 410J, respectively). The metal lines 412 may include other metal lines distributed in multiple metal layers, such as the first metal layer closest to the substrate, the second metal layer over the first metal layer, the third metal layer over the second metal layer, and so on. Particularly, the metal line 412G is connected down through the via 410G and the S/D contact 360G to the source of the pull-down transistors (PD-1) and connected up to the second power line (Vss), therefore also being referred by Vss. The metal line 412E is connected down through the via 410E and the S/D contact 360E to the source of the pull-up transistors PU-1 and connected up to the first power line (Vdd), therefore also being referred by Vdd. The metal line 412J is connected down through the via 410J and the S/D contact 360J to the source of the pass-gate device (PG-2) and connected up to the complimentary bit-line (BLB), therefore also being referred by BLB.

The backside interconnect structure 408 may include multiple metal layers, such as the first metal layer being closest to the substrate, the second metal layer, the third metal layer, and so on. Particularly, the backside interconnect structure 408 includes backside vias (or backside via features) 416 (e.g., backside vias 416G, 416E, 416J) landing on device features such as source/drain features; and backside metal lines 418 (e.g., metal lines 418G, 418E, 418J landing on the backside vias 416G, 416E, 416J, respectively). Particularly, the backside metal line 418G is connected through backside via 416G to the source of the pull-down transistors (PD-1) and connected down to the second power line (Vss), therefore also being referred by Vss. If the Vdd is optionally provided on the backside of the integrated circuit structure 100, the backside metal line 418E is connected up through the backside via 416E to the source of the pull-up transistors PU-1 and connected down to the first power line (Vdd), therefore also being referred by Vdd. If one or more signal lines are optionally provided on the backside of the integrated circuit structure 100, the metal line 418J is connected through the backside via 416J to the source of the pass-gate device (PG-2) and connected down to the complimentary bit-line (BLB), therefore also being referred by BLB.

Although the frontside interconnect structure 406 illustrates metal lines in one metal layer, and via features and contact features between the frontside and the metal lines, additional metal lines and additional conductive features (such as via features between adjacent metal lines) are contemplated by the present disclosure. Similarly, although the backside interconnect structure 408 illustrates backside metal lines in single metal layer, and backside via features between the backside and the metal lines, additional backside metal lines and other conductive features (such as contact features) are contemplated by the present disclosure.

Still referring to FIGS. 6A and 6B collectively, the backside vias 416 may be formed by removing fins 320 at respective cross-sections with the S/D contacts 360 from backside of the integrated circuit structure 100 to form via holes and filling the via holes with conductive material(s). Each of the cross-sections generally has a dimension W1 along the Y-direction, L1 along the X-direction, and a height of H1 in the Z-direction. Taking the backside via 416E as an example, it has an opening of W1×L1, and an aspect ratio of H1/W1. With the ever-decreasing geometry size, the CD (W1) of the fins 320 has become so small such that the via holes consequently have a small opening and a large aspect ratio. The small opening and the large aspect ratio reduce the process window for filling conductive material(s), which may lead to incomplete via formation and overlay error. Further, expanding the dimension(s) of the backside via 416E along the X-direction and/or the Y-direction may not be feasible, as the etching of an expanded via hole may also etch through dielectric layer between the via hole and the gate structures and cause metal gate protrusion and device malfunction. On the other hand, regarding the backside via 416G, the CMG feature 350A between the two cross-sections between the fins 320A/320A' and the S/D contact 360G protects the gate structure and allows the backside vias to expand along the Y-direction without further risk of causing metal gate protrusion. Therefore, the otherwise two separated backside vias may form one continuous backside via 416G straddling the CMG feature 350A. The resulting backside via 416G has two leg portions filling the two via holes on two sides of the CMG feature 350A and a center portion expanding over the CMG feature 350A and connecting the two leg portions. It can also be considered as a conductive structure including a first backside via formed on the backside of the fin 320A', a second backside via formed on the backside of the fin 320A, and a conductive feature connecting the first and second backside vias and across the CMG feature 350A.

The backside via 416G has an expanded opening of (2W1+D1)×L1 and a reduced via hole aspect ratio of H2/W1. Compared with the backside via 416E's opening of W1×L1, the backside via 416G's opening may be five to ten times larger. Compared with the backside via 416E's aspect ratio of H1/W1, the backside via 416G's aspect ratio may be 30% to 60% smaller. The expanded opening and the reduced-aspect-ratio of via holes enlarge the process window, reduce difficulty of filling conductive material(s) in high-aspect-ratio via holes, and mitigate overlaying inaccuracy. Similarly, the CMG feature 350 adjacent the backside via 416J may allow the backside via 416J to asymmetrically expand its opening on one side towards the CMG feature 350 and abut the CMG feature 350 without risking metal gate protrusion. Thus, from a top view as shown in FIG. 6A, the backside vias may have three dimensions—the backside via 416G for Vss has a largest opening of (2W1+D1)×L1, the backside via 416E for Vdd has the smallest opening of W1×L1, and the backside via 416J for the signal line (e.g., BLB) has an opening therebetween.

Figure 7:
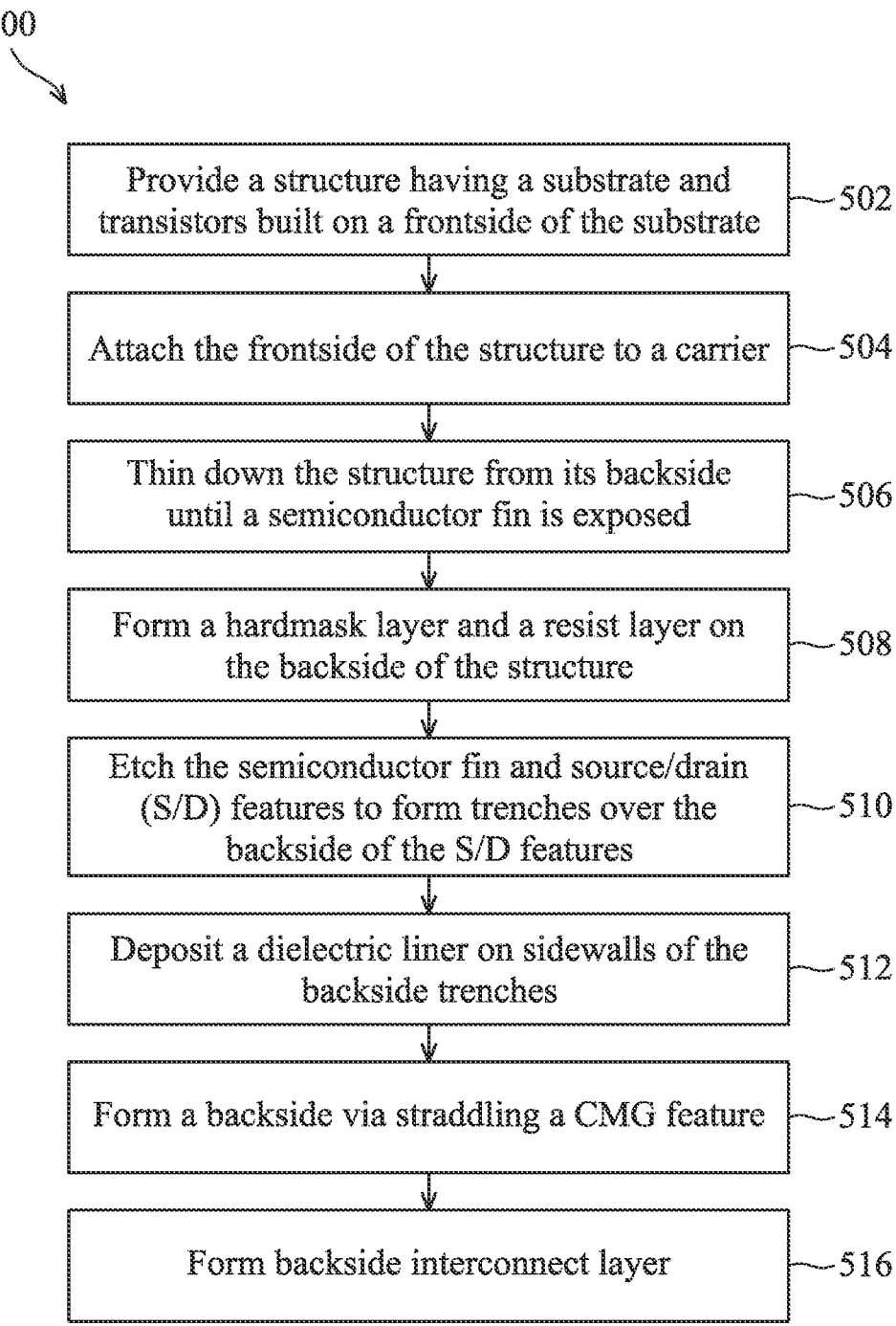
FIG. 7 shows a flow chart of a method for forming an integrated circuit having a plurality of SRAM cells, in accordance with some embodiments of the present disclosure.

FIG. 7 illustrates a flow chart of a method 500 for fabricating a semiconductor device (or device) 600 that is substantially similar to or as a portion of the integrated circuit structure 100 as depicted in FIGS. 1-6 according to various embodiments of the present disclosure. Additional processing is contemplated by the present disclosure. Additional operations can be provided before, during, and after method 500, and some of the operations described can be moved, replaced, or eliminated for additional embodiments of method 500.

The method 500 is described below in conjunction with FIG. 8 through FIG. 16 that illustrate cross-sectional views of the semiconductor device 600 at various steps of fabrication according to the method 500, in accordance with some embodiments. The cross-sectional views of the device 600 in FIG. 8 through FIG. 16 are along the A-A line in FIG. 6A and illustrate the formation of, among other features, a backside via straddling a CMG feature in a source/drain region, which is substantially similar to the backside via 416G. FIG. 8 through FIG. 16 have been simplified for the sake of clarity to better understand the inventive concepts of the present disclosure. Additional features can be added in the device 600, and some of the features described below can be replaced, modified, or eliminated in other embodiments of the device 600. For example, the formation of backside vias for Vdd and signal lines (e.g., the backside vias 416E, 416J in FIG. 6B) are omitted in FIG. 8 through FIG. 16 but contemplated by the exemplary operations of the method 500 discussed in detail below.

At operation 502, the method 500 (FIG. 7) provides the device 600 having a substrate 602 at its backside and various elements including transistors built on its frontside. These elements include an isolation structure 604 over the substrate 602, two semiconductor fins (or fins) 606 (e.g., corresponding to the fins 320A', 320A in FIG. 6A) protruding upwardly from the substrate 602 and adjacent to the isolation structure 604, S/D features 608 over the fins 606. The device 600 further includes a contact etch stop layer (CESL) 610 on sidewalls of the S/D features 608 and over the isolation structure 604, a first inter-layer dielectric (ILD) layer 612 over the CESL 610, and a second ILD layer 614 over the first ILD layer 612. The first and second ILD layers may be separated by an etch stop layer (ESL) 616. Not depicted in FIG. 8, but in the direction in-and-out of the paper, there are also one or more semiconductor channel layers (or channel layers) suspended over the fins 606 in the channel region of the transistors and connecting a pair of the S/D features 608 on two ends of the channel layers, a gate structure (or referred to as gate stack) wrapping around each of the channel layers, and inner spacers between the S/D features 608 and the gate stack. The device 600 also includes a CMG feature 618 (e.g., corresponding to the CMG feature 350A in FIG. 6A) divides the gate stack into segments, a gate spacer 619 disposed on sidewalls of the gate stack and extending into the source/drain region as on sidewalls of the buffer epitaxial layer 608a, an S/D contact 620 (corresponding to the S/D contact 360G in FIG. 6A) disposed on the two S/D features 608 and the CMG feature 618, and silicide features 622 interposed between the S/D features 608 and the S/D contact 620.

The device 600 further includes one or more interconnect layers with wires and vias embedded in dielectric layers. The one or more interconnect layers connecting gate, source, and drain electrodes of various transistors, as well as other circuits in the device 600, to form an integrated circuit in part or in whole. The device 600 may further include passivation layers, adhesion layers, and/or other layers built on the frontside of the device 600. These layers and the one or more interconnect layers are collectively denoted with the label 624. The interconnect layers 624 include an S/D contact via 626 landing on the S/D contact 620, a first metal line 628 in the M0 interconnect layer disposed on the S/D contact via 626, and a second metal line 630 in the M1 interconnect layer disposed on the first metal line 628. The various elements of the device 600 are further described below.

In some embodiments, the substrate 602 is a bulk silicon substrate (i.e., including bulk single-crystalline silicon). The substrate 602 may include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. In an alternative embodiment, the substrate 602 is a semiconductor-on-insulator substrate, such as a silicon-on-insulator (SOI) substrate, a silicon germanium-on-insulator (SGOI) substrate, or a germanium-on-insulator (GOI) substrate.

In some embodiments, the fins 606 may include silicon, silicon germanium, germanium, or other suitable semiconductor, and may be doped n-type or p-type dopants. The fin 606 may be patterned by any suitable method. For example, the fin 606 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fin 606. For example, the masking element may be used for etching recesses into semiconductor layers over or in the substrate 602, leaving the fins 606 on the substrate 602. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid (CH₃COOH); or other suitable wet etchant. Numerous other embodiments of methods to form the fins 606 may be suitable.

The isolation structure 604 may include silicon oxide, silicon nitride, silicon oxynitride, other suitable isolation material (for example, including silicon, oxygen, nitrogen, carbon, or other suitable isolation constituent), or combinations thereof. The isolation structure 604 can include different structures, such as shallow trench isolation (STI) features and/or deep trench isolation (DTI) features. In an embodiment, the isolation structure 604 can be formed by filling the trenches between the fins 606 with insulator material (for example, by using a CVD process or a spin-on glass process), performing a chemical mechanical polishing (CMP) process to remove excessive insulator material and/or planarize a top surface of the insulator material layer, and etching back the insulator material layer to form the isolation structure 604. In some embodiments, the isolation structure 604 include multiple dielectric layers, such as a silicon nitride layer disposed over a thermal oxide liner layer.

The S/D features 608 include epitaxially grown one or more layers of semiconductor materials such as epitaxially grown silicon, germanium, or silicon germanium. In the depicted embodiment, the S/D features 608 includes a buffer epitaxial layer 608a, an intermediate layer 608b, and a doped epitaxial layer 608c. By way of example, epitaxial growth of the buffer epitaxial layer 608a may be performed by vapor-phase epitaxy (VPE), ultra-high vacuum chemical vapor deposition (UHV-CVD), molecular beam epitaxy (MBE), and/or other suitable processes. In some embodiments, the buffer epitaxial layer 608a include the same material as the substrate 602, such as silicon (Si). In some alternative embodiments, the buffer epitaxial layer 608a includes a different semiconductor material than the substrate 602, such as silicon germanium (SiGe). In some embodiments, the buffer epitaxial layer 608a is dopant-free, where for example, no intentional doping is performed during the epitaxial growth process. Alternatively, the buffer epitaxial layer 608a may be slightly doped with dopants such as Ge or Sn. As a comparison, in one instance, the substrate 602 is lightly doped and has a higher doping concentration than the buffer epitaxial layer 608a. The buffer epitaxial layer 608a provides a high resistance path from the upper portions of the S/D features to the semiconductor substrate, such that the leakage current through the semiconductor substrate is suppressed.

The intermediate layer 608b may be conformally deposited over the device 600. In various examples, the intermediate layer 608b is a nitride layer blanket deposited by a chemical vapor deposition (CVD) process, a subatmospheric CVD (SACVD) process, a flowable CVD process, an atomic layer deposition (ALD) process, a physical vapor deposition (PVD) process, and/or other suitable process. The intermediate layer 608b may be also referred to as a blanket nitride layer. In some embodiments, the blanket nitride layer 608b includes silicon nitride (SiN). Subsequently, the doped epitaxial layer 608c is formed on the blanket nitride layer 608b. After the forming of the doped epitaxial layer 608c, an etching process is performed to remove portions of the blanket nitride layer 608b not stacked between the epitaxial layers 608a and 608c. The blanket nitride layer 608b functions as an etch stop layer in subsequent backside etching process. By way of example, the doped epitaxial layer 608c may be formed by any epitaxy processes including VPE, UHV-CVD, MBE, and/or other suitable processes. The doped epitaxial layer 608c may be doped with n-type dopants and/or p-type dopants. In some embodiments, for n-type transistors, the doped epitaxial layer 608c include silicon and can be doped with carbon, phosphorous, arsenic, other n-type dopant, or combinations thereof (for example, forming Si:C epitaxial S/D features, Si:P epitaxial S/D features, or Si:C:P epitaxial S/D features). In some embodiments, for p-type transistors, the doped epitaxial layer 608c include silicon germanium or germanium, and can be doped with boron, other p-type dopant, or combinations thereof (for example, forming Si:Ge:B epitaxial S/D features). In one embodiment, the doped epitaxial layer 608c and the buffer epitaxial layer 608a are both formed of silicon (Si). In another embodiment, the doped epitaxial layer 608c is formed of silicon (Si) and the buffer epitaxial layer 608a is formed silicon germanium (SiGe). The doped epitaxial layer 608c may further include multiple epitaxial semiconductor layers having different levels of dopant density. In some embodiments, annealing processes (e.g., rapid thermal annealing (RTA) and/or laser annealing) are performed to activate dopants in the doped epitaxial layer 608c.

In some embodiments, the channel layers (not shown in FIG. 8) include a semiconductor material suitable for transistor channels, such as silicon, silicon germanium, or other semiconductor material(s). The channel layers may be in the shape of rods, bars, sheets, or other shapes in various embodiments. In an embodiment, the channel layers are initially part of a stack of semiconductor layers that include the channel layers and other sacrificial semiconductor layers alternately stacked layer-by-layer. The sacrificial semiconductor layers and the channel layers include different material compositions (such as different semiconductor materials, different constituent atomic percentages, and/or different constituent weight percentages) to achieve etching selectivity. During a gate replacement process to form the gate stack, the sacrificial semiconductor layers are selectively removed, leaving the channel layers suspended over the fins 606 in the channel region.

In some embodiment, the gate stack (e.g., corresponding to gate stacks 330 in FIGS. 4-6A, not shown in FIG. 8) includes a gate dielectric layer and a gate electrode layer. The gate dielectric layer may include a high-k dielectric material such as HfO₂, or other suitable high-k dielectric material. The high-k dielectric material generally refers to dielectric materials having a high dielectric constant, for example, greater than that of silicon oxide (k≈3.9). The gate dielectric layer may be formed by chemical oxidation, thermal oxidation, ALD, CVD, and/or other suitable methods. In some embodiments, the gate stack further includes an interfacial layer between the gate dielectric layer and the channel layers. The interfacial layer may include silicon dioxide, silicon oxynitride, or other suitable materials. In some embodiments, the gate electrode layer includes an n-type or a p-type work function layer and a metal fill layer. For example, an n-type work function layer may comprise a metal with sufficiently low effective work function such as titanium, aluminum, tantalum carbide, tantalum carbide nitride, tantalum silicon nitride, or combinations thereof. For example, a p-type work function layer may comprise a metal with a sufficiently large effective work function, such as titanium nitride, tantalum nitride, ruthenium, molybdenum, tungsten, platinum, or combinations thereof. For example, a metal fill layer may include aluminum, tungsten, cobalt, copper, and/or other suitable materials. The gate electrode layer may be formed by CVD, PVD, plating, and/or other suitable processes. Since the gate stack includes a high-k dielectric layer and metal layer(s), it is also referred to as a high-k metal gate.

In some embodiments, the gate spacer 619 includes a dielectric material such as a dielectric material including silicon, oxygen, carbon, nitrogen, other suitable material, or combinations thereof (e.g., silicon oxide, silicon nitride, silicon oxynitride (SiON), silicon carbide, silicon carbon nitride (SiCN), silicon oxycarbide (SiOC), silicon oxycarbon nitride (SiOCN)). In some embodiments, the gate spacer 619 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). For example, a dielectric layer including silicon and nitrogen, such as a silicon nitride layer, can be deposited over a dummy gate stack (which is subsequently replaced by the high-k metal gate) and subsequently etched (e.g., anisotropically etched) to form the gate spacer 619. The gate spacer 619 is deposited on sidewalls of the fins 606 not covered by the dummy gate stack such as in the source/drain region. After the fins 606 are recessed in the source/drain region and the S/D features 608 are epitaxially grown on remaining portions of the fins 606, the gate spacer 619 remains on sidewalls of the bottom portion of the S/D feature 608, such as on sidewalls of the buffer epitaxial layer 608a. In some embodiments, the gate spacer 619 includes a multi-layer structure, such as a first dielectric layer that includes silicon nitride and a second dielectric layer that includes silicon oxide.

In some embodiments, the CESL 610 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 612 and/or the ILD layer 614 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD layer 612 and/or the ILD layer 614 may be formed by PE-CVD (plasma enhanced CVD), F-CVD (flowable CVD), or other suitable methods.

In some embodiments, the silicide features 622 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

In an embodiment, the S/D contacts 620 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contacts 620.

Figure 8:
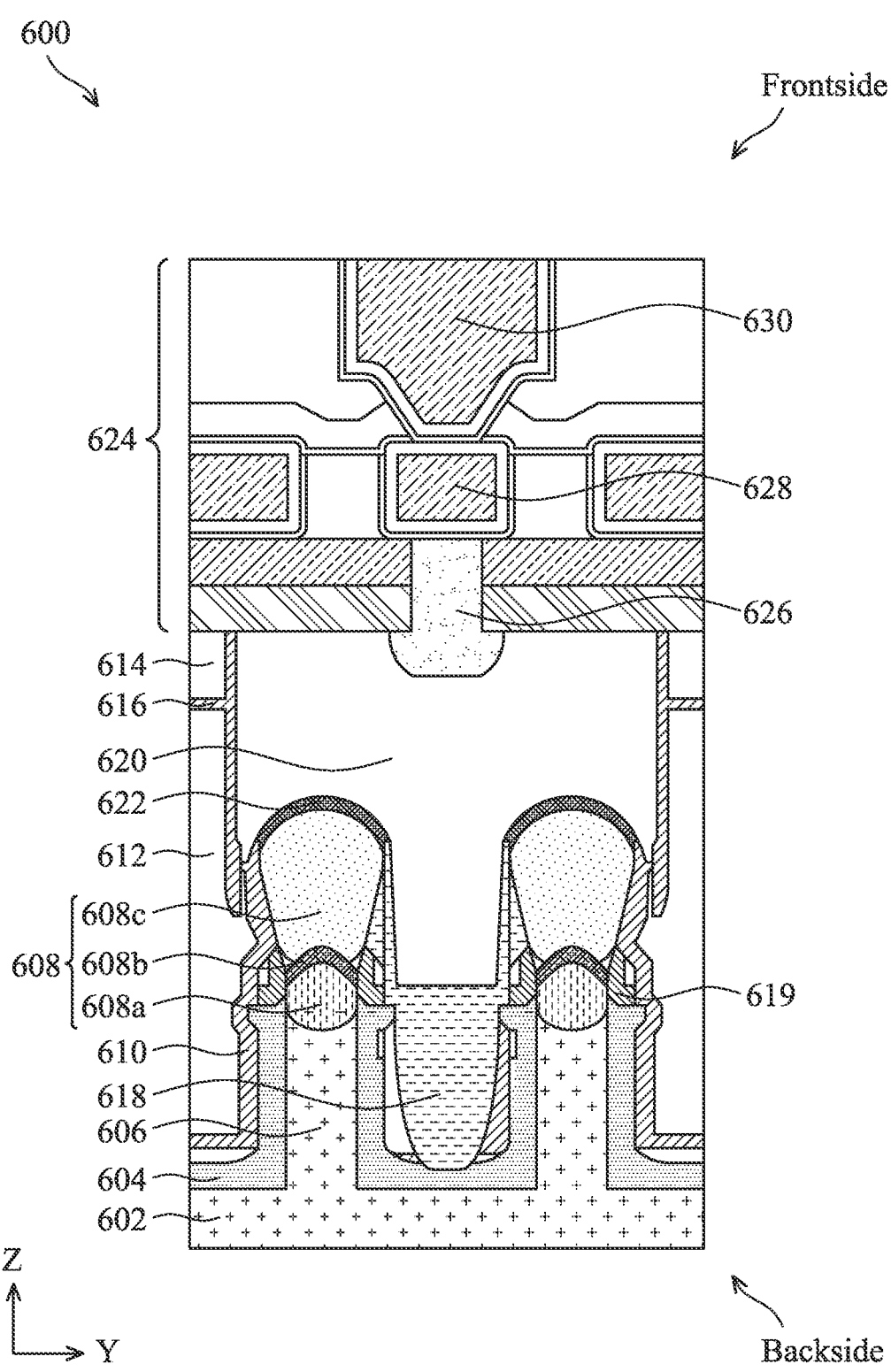
FIGS. 8, 9, 10, 11, 12, 13, 14, 15, and 16 illustrate cross-sectional views of an integrated circuit having SRAM cells during fabrication processes according to the method of FIG. 7, in accordance with some embodiments of the present disclosure.

In some embodiments, the CMG feature 618 may include one or more dielectric materials, such as silicon nitride, silicon oxide, silicon oxynitride, fluoride-doped silicate glass (FSG), a low-k dielectric material, and/or other suitable insulating material; and may be formed by CVD, PVD, ALD, or other suitable methods. The CMG feature 618 fills in a CMG trench and separates a gate structure into two segments in the channel region. The CMG feature 618 also extends into the source/drain region and disposes between the two adjacent S/D features 608. During the S/D contact formation, the CMG feature 618 is recessed in the source/drain region to form S/D recesses. As a result, a top surface of the CMG feature 618 in the channel region is above the S/D features 608, but a top surface of the CMG feature 618 in the source/drain region is below the S/D features 608, such as below a bottom surface of the dopped epitaxial layer 608c, as shown in FIG. 8.

In some embodiments, the S/D contact via 626 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted in the S/D contact via 626.

Figure 9:
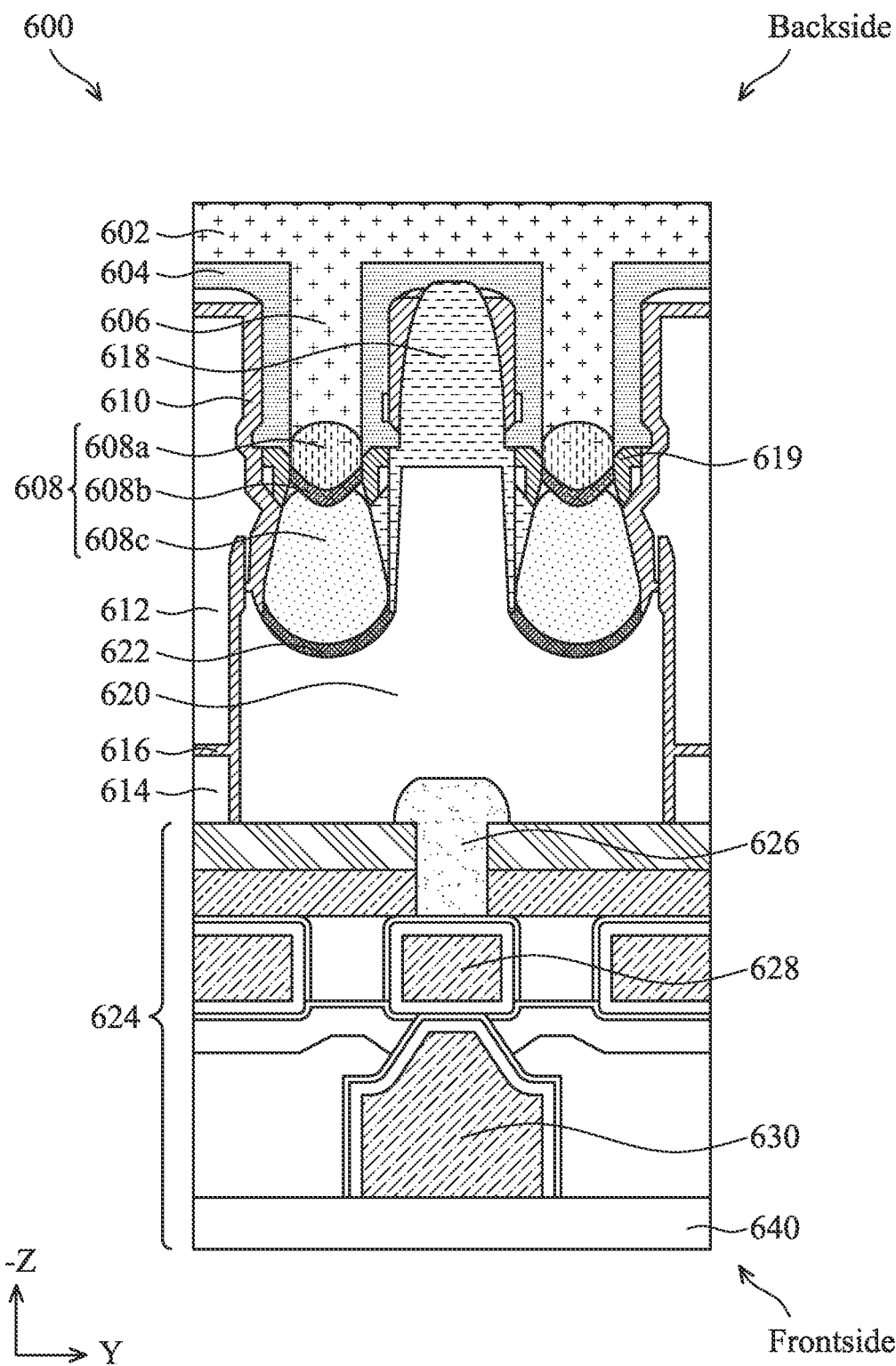

At operation 504, the method 500 (FIG. 7) flips the device 600 upside down and attaches the frontside of the device 600 to a carrier 640, such as shown in FIG. 9. This makes the device 600 accessible from the backside of the device 600 for further processing. The operation 504 may use any suitable attaching processes, such as direct bonding, hybrid bonding, using adhesive, or other bonding methods. The operation 504 may further include alignment, annealing, and/or other processes. The carrier 640 may be a silicon wafer in some embodiments. In FIGS. 8-16, the "Z" direction points from the backside of the device 600 to the frontside of the device 600, while the "−Z" direction points from the frontside of the device 600 to the backside of the device 600.

Figure 10:

At operation 506, the method 500 (FIG. 7) thins down the device 600 from the backside of the device 600 until the fins 606 and the isolation structure 604 are exposed from the backside of the device 600, such as shown in FIG. 10. The thinning process may include a mechanical grinding process and/or a chemical thinning process. A substantial amount of substrate material may be first removed from the substrate 602 during a mechanical grinding process. Afterwards, a chemical thinning process may apply an etching chemical to the backside of the substrate 602 to further thin down the substrate 602.

Figure 11:
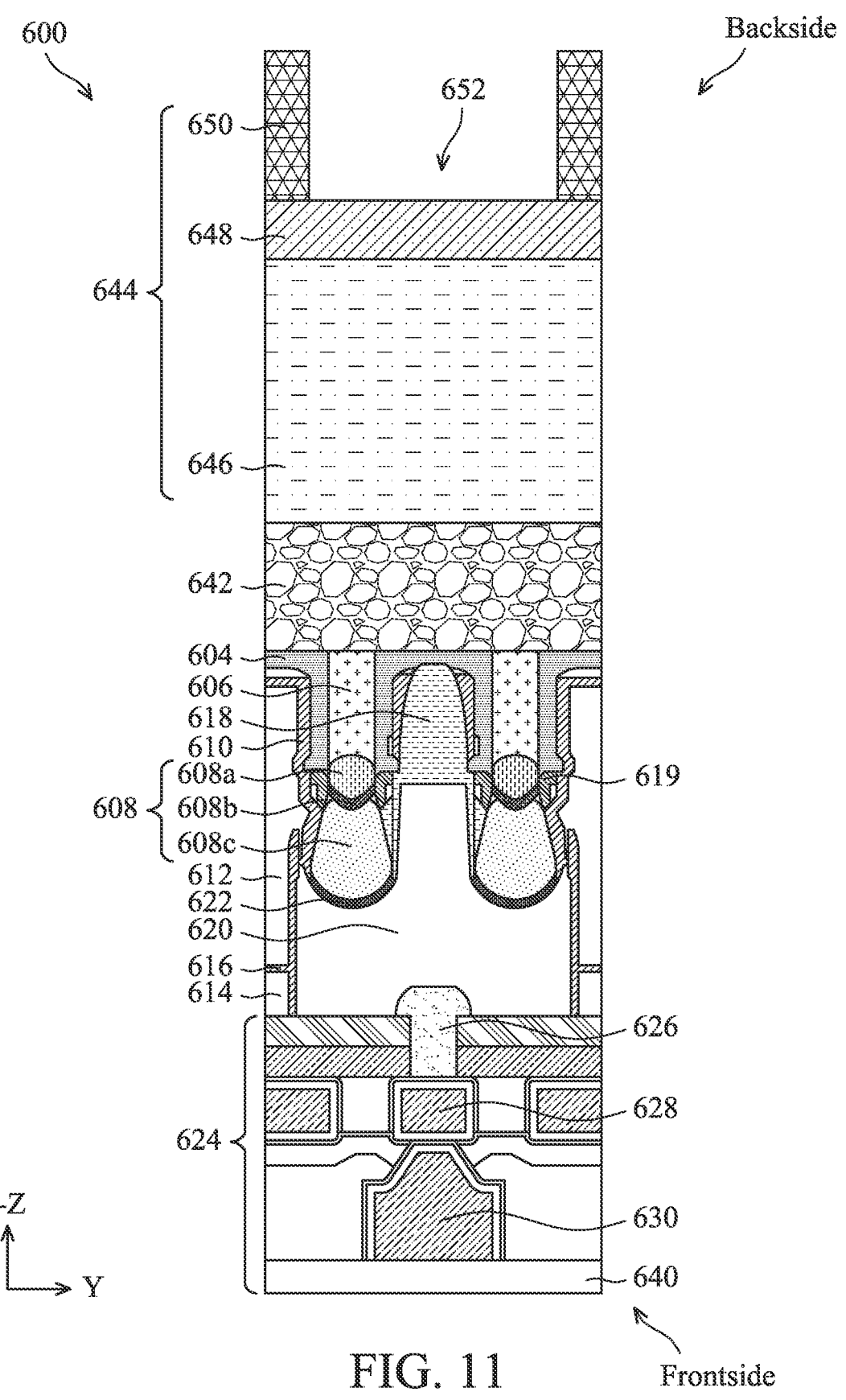

At operation 508, the method 500 (FIG. 7) forms a hardmask layer 642 over the backside of the device 600 and a tri-layer resist layer 644 over the hardmask layer 642, such as shown in FIG. 11. The hardmask layer 642 may include an oxide (e.g., $SiO_2$), a nitride (e.g., SiN), an oxy-nitride (e.g., $SiO_xN_y$), or the like. In further embodiments, the hardmask layer 642 is $SiO_2$. In yet further embodiments, the hardmask layer 642 is a high-temperature oxide (HTO) (e.g., $SiO_2$ formed by a high-temperature deposition/growth process). In some embodiments, a process for forming the hardmask layer 642 comprises depositing a dielectric material on the backside of the device 600 by, for example, CVD, PVD, ALD, sputtering, some other deposition process, or a combination thereof.

The tri-layer resist layer 644 includes a bottom layer 646 over the hardmask layer 642, a middle layer 648 over the bottom layer 646, and an upper layer 650 over the middle layer 648. The bottom layer 646 may be a bottom anti-reflective coating (BARC). The bottom layer 646 may include organic materials. The middle layer 648 may be formed from or include an inorganic material, which may be a nitride (such as silicon nitride), an oxynitride (such as silicon oxynitride), an oxide (such as silicon oxide), or the like. The upper layer 650 is a photosensitive material. The middle layer 648 has a high etching selectivity relative to the upper layer 650 and the bottom layer 646. As a result, the upper layer 650 is used as an etching mask for the patterning of the middle layer 648, and the middle layer 648 is used as an etching mask for the patterning of the bottom layer 646. In some embodiments, the resist layer formed over the hardmask layer 642 may be another type of photoresist, such as a single-layer photoresist, a bi-layer photoresist, or the like. The upper layer 650 is patterned using any suitable photolithography technique to form trench opening 652 therein. As an example of patterning the upper layer 650, the upper layer 650 may be exposed to a radiation beam including an UV or an excimer laser such as a 248 nm beam from a Krypton Fluoride (KrF) excimer laser, a 193 nm beam from an Argon Fluoride (ArF) excimer laser, or a 157 nm beam from a $F_2$ excimer laser. Exposure of the photosensitive material may be performed using an immersion lithography system to increase resolution and decrease the minimum achievable pitch. A bake or cure operation may be performed to harden the upper layer 650, and a developer may be used to remove either the exposed or unexposed portions of the upper layer 650 depending on whether a positive or negative resist is used.

Figure 12:
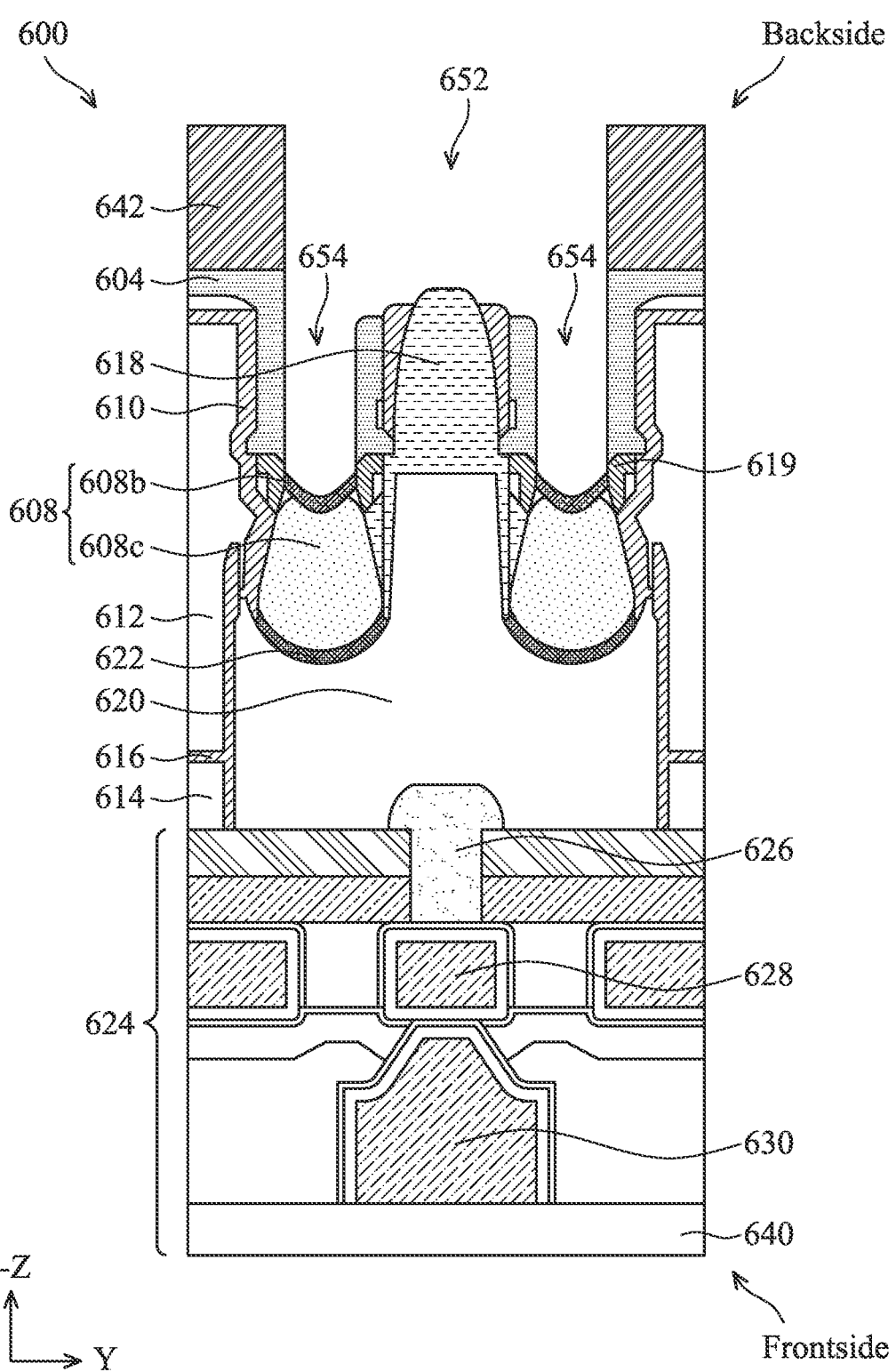

At operation 510, the method 500 (FIG. 7) extends the trench opening 652 to the hardmask layer 642 and selectively etches the fin 606 to form backside via holes 654 by etching through the trench opening 652, as shown in FIG. 12. The pattern of the upper layer 650 is transferred to the middle layer 648 using a suitable etching process. In some embodiments, the middle layer 648 may be trimmed, to increase the side of the trench opening 652 in the middle layer 648. After the trimming process, a suitable etching process is performed to transfer the pattern of the middle layer 648 to the bottom layer 646, thereby extending the trench opening 652 through the bottom layer 646. Further, the pattern of the bottom layer 646 is transferred to the hardmask layer 642 using a suitable etching process. In an embodiment, the etching process used to etch the bottom layer 646 is continued to etch the hardmask layer 642. During the etching process, the upper layer 650, middle layer 648, and bottom layer 646 may be consumed. In some embodiments, an ashing process may be performed to remove remaining residue of the bottom layer 646. After the patten of the hardmask layer 642 exposes the backside of the device 600, the operation 510 applies an etching process that is tuned to be selective to the materials of the semiconductor material (e.g. silicon) in the fins 606. In the present embodiment, the etching process also etches the buffer epitaxial layer 608a of the S/D features 608. The blanket nitride layer 608b of the S/D features 608 functions as an etch stop layer to protect the doped epitaxial layer 608c from being etched. The etching of the fins 606 and the buffer epitaxial layer 608a may include a first etching to selectively etch the fins 606 and a second etching to selective etch the buffer epitaxial layer 608a. The etching process(es) can be dry etching, wet etching, reactive ion etching, or other suitable etching methods. The etching process(es) also consumes a horizontal portion of the isolation structure 604 covering the CMG feature 618, such that the bottom surface of the CMG feature 618 is exposed in the trench opening 652. Alternatively, the horizontal portion of the isolation structure 604 may be etched in a separate etch process that is selective to the materials of the isolation structure 604 with no (or minimum) etch lost to the CMG feature 618. The separate etching process may be an anisotropic etch process, such that the vertical portions of the isolation structure 604 disposed on sidewalls of the CMG feature 618 remain intact. The etch selectivity of the CMG feature 618 protects the gate stack from being accidentally exposed in the trench opening 652 if over-etch occurs, as the edge of the trench opening 652 may be getting too close to the gate stack in the X-direction during the etching process.

Figure 13:
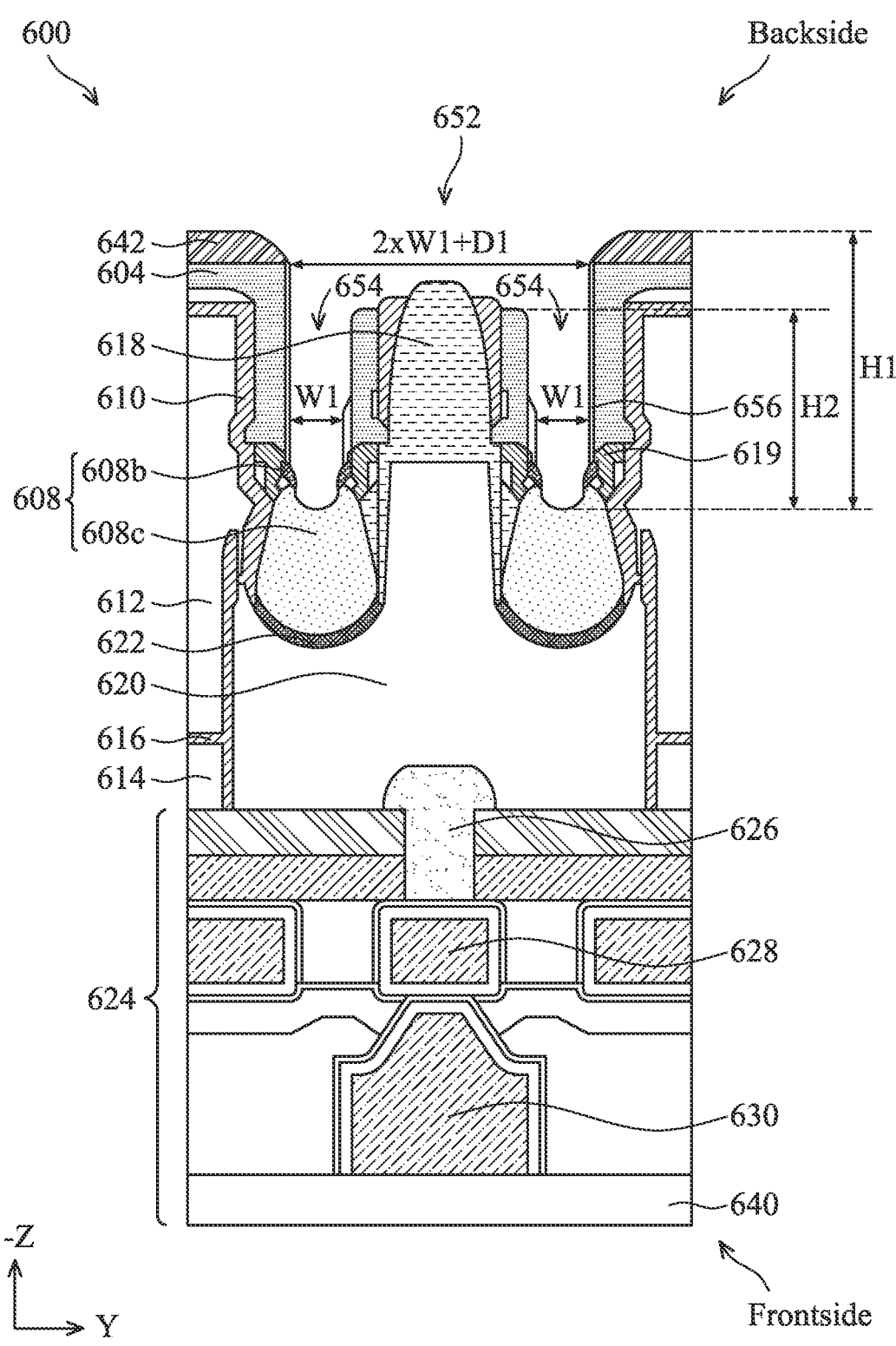

At operation 512, the method 500 (FIG. 7) deposits a dielectric liner 656 on sidewalls of the trench opening 652 (including backside via holes 654), such as shown in FIG. 13. The dielectric liner 656 further protects the gate stack from metal element diffusion when conductive features are subsequently formed in the trench opening 652. In the illustrated embodiment, the dielectric liner 656 is conformally deposited to have a substantially uniform thickness along the various surfaces of the backside of the device 600. In various embodiments, the dielectric liner 656 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, combinations thereof, or other suitable material(s). The dielectric liner 656 may be deposited using ALD, CVD, or other suitable methods. Subsequently, an etching process is performed for breaking through, and removing the majority of, the horizontal portions of the dielectric liner 656. The etching process is also referred to as a breakthrough (BT) etching process. In some embodiments, the BT etching process may include an anisotropic dry etch process, or the like. In some embodiments where the dielectric liner 656 is formed of an oxide compound, the BT etch process is a reactive ion etch (RIE) process with etch process gases including $CHF_3$, Ar, $CF_4$, $N_2$, $O_2$, $CH_2F_2$, $SF_3$, the like, or a combination thereof. The RIE process may be performed for an etch time between about 2 seconds and about 20 seconds, at a pressure between about 2 mTorr and about 30 mTorr, a temperature between about 10° C. and about 100° C., a radio frequency (RF) power between about 100 W and about 1500 W, and a voltage bias between about 10 V and about 800 V. In the illustrated embodiment, as a result of the operation 512, portions of the dielectric liner 656 remain on sidewalls of the isolation structure 604. The dielectric liner 656 may also be in contact with the gate spacer 619 and the blanket nitride layer 608b in the depicted embodiment. Due to the loading effect, a vertical length of the dielectric liner 656 on the sidewall close to the CMG feature 618 is lower than on the other sidewall close to the ILD layer 612. After the BT etching process, the blanket nitride layer 608b as an etch stop layer is exposed in the backside via holes 654. Subsequently, an etching process is applied to remove the exposed portion of the blanket nitride layer 608b. The etching process(es) can be dry etching, wet etching, reactive ion etching, or other etching methods. At the conclusion of the operation 512, the backside via holes 654 exposes bottom surface of the doped epitaxial layer 608c of the S/D features 608 from the backside. A portion of the blanket nitride layer 608b is remained between the doped epitaxial layer 608c and the dielectric liner 656.

The trench opening 652 provides a much larger opening than the backside via holes 654 alone. As discussed above, the trench opening 652 has an opening width 2W1+D1 along the Y-direction, which may be five to ten times larger than the opening width W1 of the backside via holes 654. Further, the aspect ratio of the backside via holes 654 is reduced to H2/W1 instead of H1/W1, which is about 30% to about 60% smaller. The expanding opening and the reduced-aspect-ratio of backside via holes enlarge the process window, reduce difficulty of filling conductive material(s) in otherwise high-aspect-ratio via holes, and mitigate overlaying inaccuracy in backside lithography processes.

Figure 14:
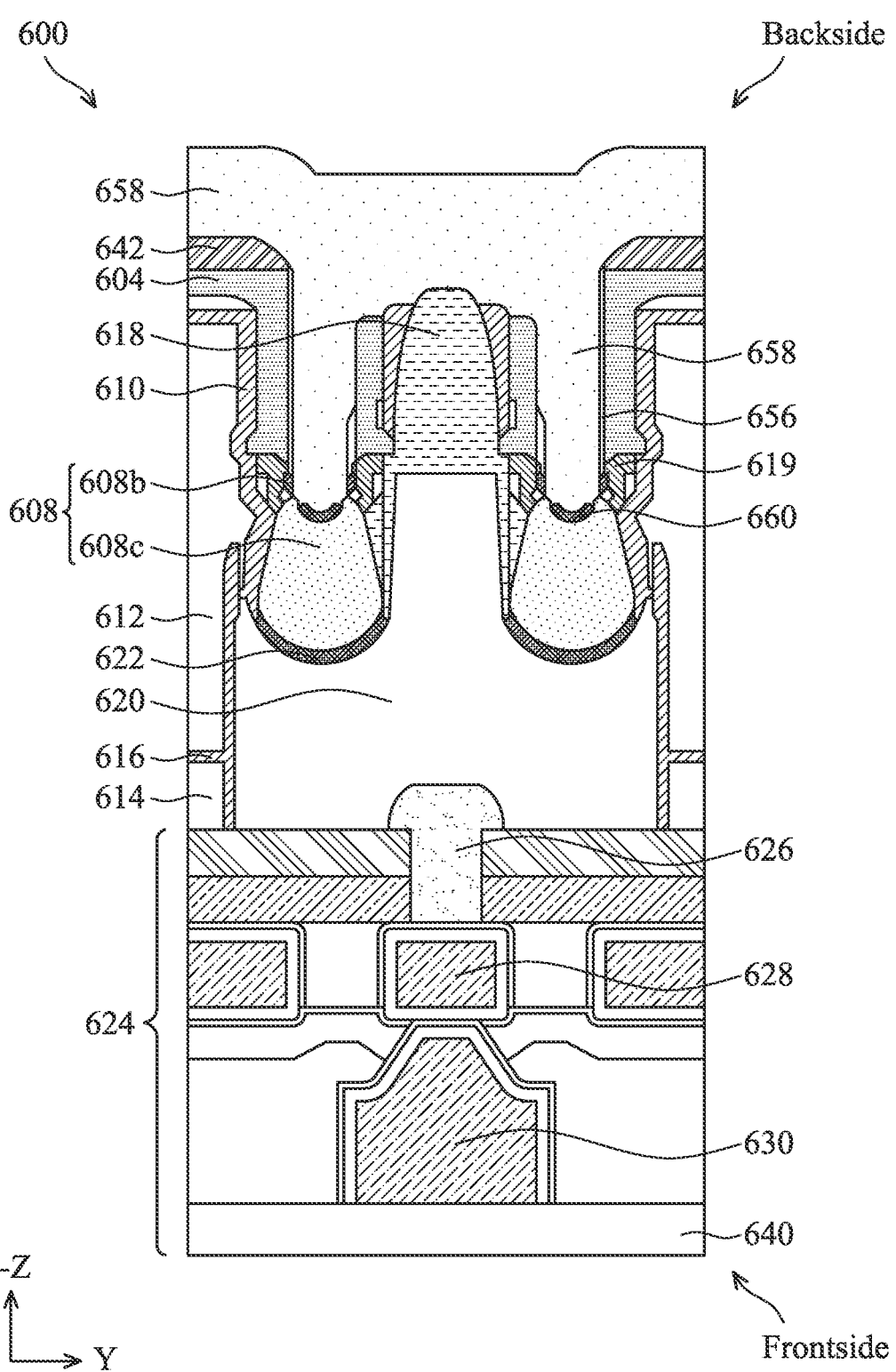
Figure 15:
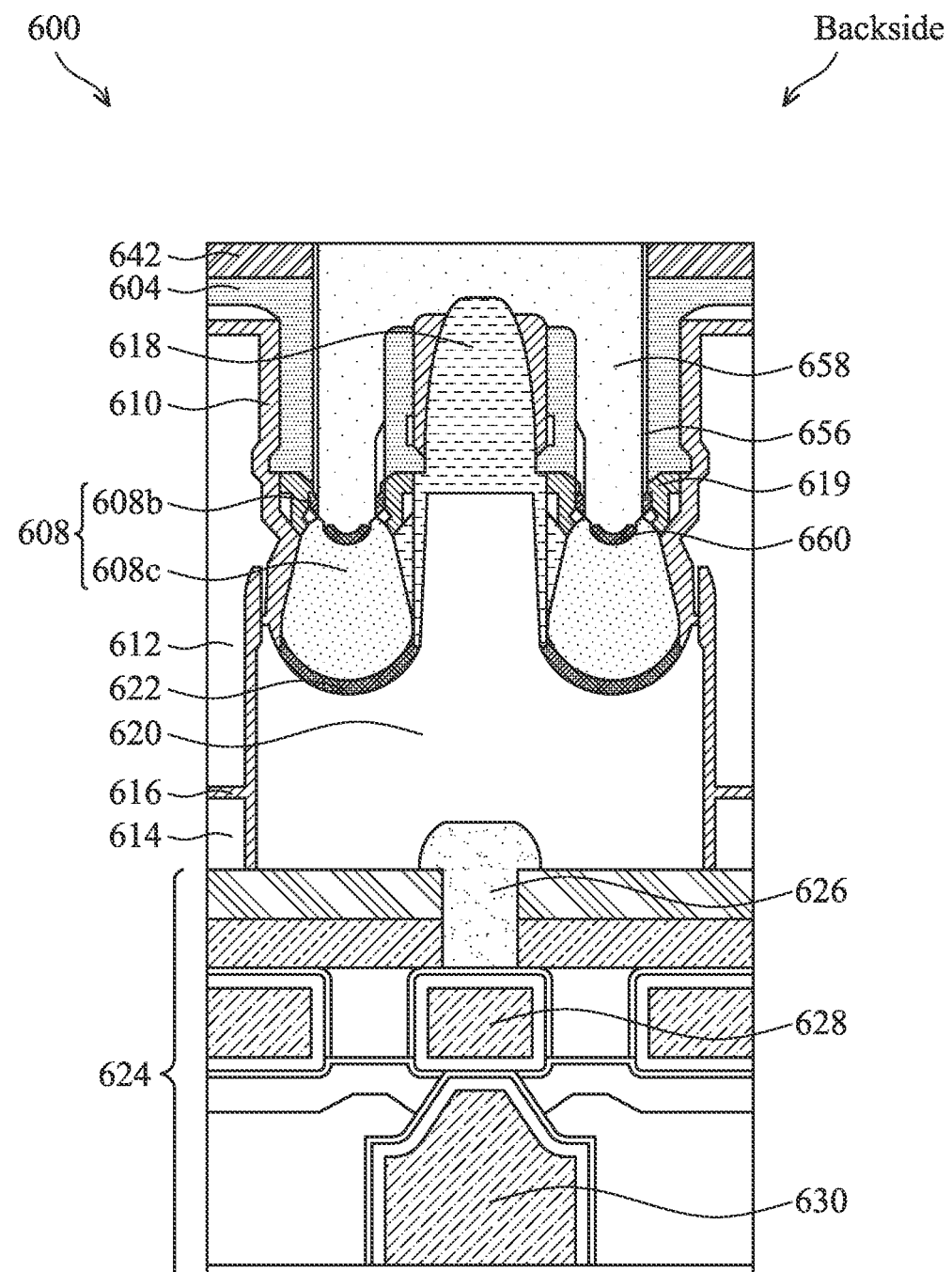

At operation 514, the method 500 (FIG. 7) forms a backside via 658 in the trench opening 652, as shown in FIGS. 14 and 15. In some embodiments, the backside via 658 is formed by filling the trench opening 652 (including the backside via holes 654) with one or more conductive materials, such as shown in FIG. 14, and subsequently removing excessive conductive materials from the backside of the device 600 in a planarization process, such as shown in FIG. 15. The leg portions of the backside via 658 filling the backside via holes 654 are landing on the two S/D features 608, and the middle portion of the backside via 658 is in contact with the CMG feature 618. The leg portions and the middle portion of the backside via 658 form a continuous conductive structure that ties the two S/D features 608 to the same power line (e.g., Vss). The backside via 658 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be formed by CVD, PVD, ALD, plating, or other suitable processes. In the illustrated embodiment, the operation 514 forms a backside silicide feature 660 on the bottom surface of the doped epitaxial layer 608c of the S/D features 608. The backside silicide feature 660 reduces contact resistance between the S/D features 608 and the backside via 658. In furtherance of the embodiment, the operation 514 first deposits one or more metals into the backside via holes 654, performing an annealing process to the device 600 to cause reaction between the one or more metals and the S/D features 608 to produce the silicide feature, and removing un-reacted portions of the one or more metals, leaving the silicide feature in the backside via holes 654. The one or more metals may include titanium (Ti), tantalum (Ta), tungsten (W), nickel (Ni), platinum (Pt), ytterbium (Yb), iridium (Jr), erbium (Er), cobalt (Co), or a combination thereof (e.g., an alloy of two or more metals) and may be deposited using CVD, PVD, ALD, or other suitable methods. The backside silicide feature 660 may include titanium silicide (TiSi), nickel silicide (NiSi), tungsten silicide (WSi), nickel-platinum silicide (NiPtSi), nickel-platinum-germanium silicide (NiPt-GeSi), nickel-germanium silicide (NiGeSi), ytterbium silicide (YbSi), platinum silicide (PtSi), iridium silicide (IrSi), erbium silicide (ErSi), cobalt silicide (CoSi), a combination thereof, or other suitable compounds. Alternatively, the backside via 658 may directly contact the two S/D features 608. A planarization operation, such as a chemical mechanical polishing (CMP) process, may also be performed to remove excessive conductive material and expose the backside of the hardmask layer 642, such as shown in FIG. 15.

Figure 16:
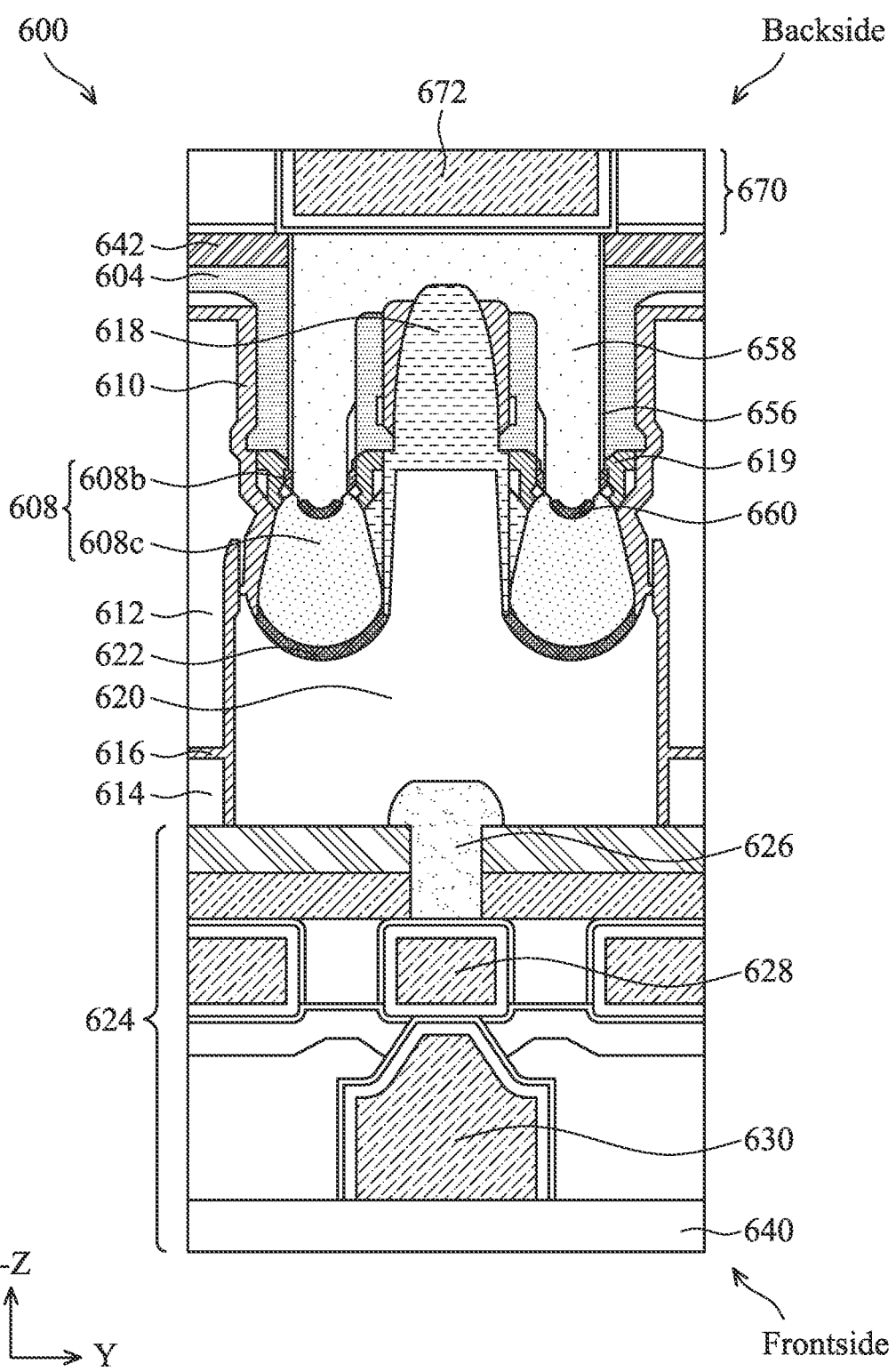

At operation 516, the method 500 (FIG. 7) forms one or more backside interconnect layers 670 with backside power rails embedded in dielectric layers on the backside of the device 600, such as shown in FIG. 16. In the illustrated embodiment, the backside power rails include a backside metal line 672 (e.g., in a backside M0 interconnect layer) that lands on the backside via 658 and electrically couples the two S/D features 608 to the grounding line Vss. The backside metal line 672 may include a conductive barrier layer and a metal fill layer over the conductive barrier layer. The conductive barrier layer may include titanium (Ti), tantalum (Ta), tungsten (W), cobalt (Co), ruthenium (Ru), or a conductive nitride such as titanium nitride (TiN), titanium aluminum nitride (TiAlN), tungsten nitride (WN), tantalum nitride (TaN), or combinations thereof, and may be formed by CVD, PVD, ALD, and/or other suitable processes. The metal fill layer may include tungsten (W), cobalt (Co), molybdenum (Mo), ruthenium (Ru), nickel (Ni), copper (Cu), or other metals, and may be formed by CVD, PVD, ALD, plating, or other suitable processes. In some embodiments, the conductive barrier layer is omitted. The backside power rails may further include other backside metal lines that electrically couple other backside vias to power line Vdd and/or signal lines (e.g., BLB). In an embodiment, the backside power rails may be formed using a damascene process, a dual-damascene process, a metal patterning process, or other suitable processes. Although not shown in FIG. 16, the backside power rails may include multiple backside interconnect layers that include contacts, vias, wires, and/or other conductive features. Having backside power rails beneficially increases the number of metal tracks available in the device 600 for directly connecting to source/drain contacts and vias. The backside power rails may have wider dimension than the first level metal (M0) tracks on the frontside of the device 600, which beneficially reduces the backside power rail resistance.

By forming the backside vias straddling the CMG features, a relatively larger contact area may be reserved between S/D features and a power rail, effectively reducing contact resistance and enlarging process windows. Moreover, a relatively larger contact area provides better overlay control between backside via and S/D features. Further, embodiments of the present disclosure can be readily integrated into existing semiconductor manufacturing processes.

In one exemplary aspect, the present disclosure is directed to a method. The method includes forming a first fin and a second fin protruding from a frontside of a substrate, forming a gate stack over the first and second fins, forming a dielectric feature dividing the gate stack into a first segment engaging the first fin and a second segment engaging the second fin, growing a first epitaxial feature on the first fin and a second epitaxial feature on the second fin, the dielectric feature being disposed between the first and second epitaxial features, performing an etching process on a backside of the substrate to form a backside trench, the backside trench exposing the dielectric feature and the first and second epitaxial features, and forming a backside via in the backside trench, the backside via straddling the dielectric feature and being in electrical connection with the first and second epitaxial features. In some embodiments, the performing of the etching process includes etching the first and second fins from the backside of the substrate. In some embodiments, the etching of the first and second fins forms a first via hole and a second via hole extending from the backside trench and exposing the first and second epitaxial features respectively, the first and second via holes are disposed on two opposing sides of the dielectric feature, and the forming of the backside via includes filling the first and second via holes and the backside trench with a conductive material. In some embodiments, the method further includes forming an isolation structure surrounding the first and second fins, the dielectric feature being disposed on the isolation structure, the performing of the etching process including removing a portion of the isolation structure directly under the dielectric feature, thereby exposing the dielectric feature in the backside trench. In some embodiments, after the performing of the etching process, the isolation structure remains on sidewalls of the dielectric feature. In some embodiments, the method further includes prior to the forming the backside via, depositing a dielectric liner on sidewalls of the backside trench. In some embodiments, each of the first and second epitaxial features includes a buffer epitaxial layer and a doped epitaxial layer over the buffer epitaxial layer, and the performing of the etching process includes removing the buffer epitaxial layer from the backside trench. In some embodiments, the method further includes forming a frontside contact feature over the first and second epitaxial features, the frontside contact feature and the backside via being coupled to a same voltage line. In some embodiments, the same voltage line is a grounding line. In some embodiments, the forming of the frontside contact feature includes recessing a portion of the dielectric feature laterally between the first and second epitaxial features.

In another exemplary aspect, the present disclosure is directed to a method of forming a memory circuit. The method includes forming a first active region and a second active region over a substrate, forming a gate structure over the substrate, the gate structure having a first portion engaging the first active region in forming a first pull-down transistor of the memory circuit and a second portion engaging the second active region in forming a second pull-down transistor of the memory circuit, forming a gate-cut feature isolating the first and second portions of the gate structure, forming a first source/drain feature of the first pull-down transistor and a second source/drain feature of the second pull-down transistor, the first and second source/drain features being disposed on two opposing sides of the gate-cut feature, selectively etching the first and second active regions from a backside of the substrate to form a trench, the trench exposing bottom surfaces of the first and second source/drain features and the gate-cut feature, and depositing a conducive material in the trench to form a backside conductive feature landing on the bottom surfaces of the first and second source/drain features and the gate-cut feature. In some embodiments, the backside conductive feature electrically couples the first and second source/drain features to a ground of the memory circuit. In some embodiments, each of the first and second active regions includes a fin protruding from the substrate. In some embodiments, each of the first and second active regions includes a plurality of channel layers vertically stacked above the substrate, and wherein each of the plurality of channel layers is wrapped around by the gate structure. In some embodiments, the backside conductive feature includes first and second leg portions in contact with the first and second source/drain features respectively and a middle portion physically connecting the first and second leg portions, and wherein the middle portion is directly under the gate-cut feature. In some embodiments, the backside conductive feature is a first backside conductive feature, and the method further includes forming a third active region over the substrate, the second portion of the gate structure also engaging the third active region in forming a pull-up transistor of the memory circuit, forming a third source/drain feature of the pull-up transistor, and forming a second backside conductive feature landing on a bottom surface of the third source/drain feature, the first and second backside conductive features being coupled to different voltage lines of the memory circuit, and in a top view an area of the first backside conductive feature being larger than that of the second backside conductive feature. In some embodiments, the first backside conductive feature is coupled to a lower voltage than the second backside conductive feature.

In yet another exemplary aspect, the present disclosure is directed to a semiconductor device. The semiconductor device includes first and second active regions extending lengthwise along a first direction, a gate stack extending lengthwise along a second direction perpendicular to the first direction, a dielectric feature extending lengthwise along the first direction and disposed between the first and second active regions, the dielectric feature dividing the gate stack into a first segment over the first active region and a second segment over the second active region; a first epitaxial feature disposed on the first active region, a second epitaxial feature disposed on the second active region, the first and second epitaxial features being disposed on two opposing sides of the dielectric feature, and a backside conductive feature electrically coupled to the first and second epitaxial features, the backside conductive feature including a first leg portion landing on a bottom surface of the first epitaxial feature, a second leg portion landing on a bottom surface of the second epitaxial feature, and a middle portion physically connecting the first and second leg portions, wherein the middle portion is directly under the dielectric feature. In some embodiments, the middle portion is in physical contact with the dielectric feature. In some embodiments, the semiconductor structure further includes a frontside contact disposed on the first and second epitaxial features, and the dielectric feature is vertically stacked between the frontside contact and the backside conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first fin and a second fin protruding from a frontside of a substrate;
   forming a gate stack over the first and second fins;
   forming a dielectric feature dividing the gate stack into a first segment engaging the first fin and a second segment engaging the second fin;
   growing a first epitaxial feature on the first fin and a second epitaxial feature on the second fin, wherein the dielectric feature is disposed between the first and second epitaxial features;
   performing an etching process on a backside of the substrate to form a backside trench, wherein the backside trench exposes the dielectric feature and the first and second epitaxial features;
   forming a backside via in the backside trench, wherein the backside via straddles the dielectric feature and is in electrical connection with the first and second epitaxial features; and
   forming a frontside contact feature over the first and second epitaxial features, wherein the frontside contact feature and the backside via are electrically coupled to a same voltage line.

2. The method of claim 1, wherein the performing of the etching process includes etching the first and second fins from the backside of the substrate.

3. The method of claim 2, wherein the etching of the first and second fins forms a first via hole and a second via hole extending from the backside trench and exposing the first and second epitaxial features respectively, the first and second via holes are disposed on two opposing sides of the dielectric feature, and the forming of the backside via includes filling the first and second via holes and the backside trench with a conductive material.

4. The method of claim 1, further comprising:

forming an isolation structure surrounding the first and second fins, wherein the dielectric feature is disposed on the isolation structure, wherein the performing of the etching process includes removing a portion of the isolation structure directly under the dielectric feature, thereby exposing the dielectric feature in the backside trench.

5. The method of claim 4, wherein after the performing of the etching process, the isolation structure remains on sidewalls of the dielectric feature.

6. The method of claim 1, further comprising:

prior to the forming the backside via, depositing a dielectric liner on sidewalls of the backside trench.

7. The method of claim 1, wherein each of the first and second epitaxial features includes a buffer epitaxial layer and a doped epitaxial layer over the buffer epitaxial layer, and the performing of the etching process includes removing the buffer epitaxial layer from the backside trench.

8. The method of claim 1, wherein the same voltage line is a grounding line.

9. The method of claim 1, wherein the forming of the frontside contact feature includes recessing a portion of the dielectric feature laterally between the first and second epitaxial features.

10. A method of forming a memory circuit, comprising:

forming a first active region and a second active region over a substrate;

forming a gate structure over the substrate, wherein the gate structure has a first portion engaging the first active region in forming a first pull-down transistor of the memory circuit and a second portion engaging the second active region in forming a second pull-down transistor of the memory circuit;

forming a gate-cut feature isolating the first and second portions of the gate structure;

forming a first source/drain feature of the first pull-down transistor and a second source/drain feature of the second pull-down transistor, wherein the first and second source/drain features are disposed on two opposing sides of the gate-cut feature;

selectively etching the first and second active regions from a backside of the substrate to form a trench, wherein the trench exposes bottom surfaces of the first and second source/drain features and the gate-cut feature; and depositing a conducive material in the trench to form a backside conductive feature landing on the bottom surfaces of the first and second source/drain features and the gate-cut feature.

11. The method of claim 10, wherein the backside conductive feature electrically couples the first and second source/drain features to a ground of the memory circuit.

12. The method of claim 10, wherein each of the first and second active regions includes a fin protruding from the substrate.

13. The method of claim 10, wherein each of the first and second active regions includes a plurality of channel layers vertically stacked above the substrate, and wherein each of the plurality of channel layers is wrapped around by the gate structure.

14. The method of claim 10, wherein the backside conductive feature includes first and second leg portions in contact with the first and second source/drain features respectively and a middle portion physically connecting the first and second leg portions, and wherein the middle portion is directly under the gate-cut feature.

15. The method of claim 10, wherein the backside conductive feature is a first backside conductive feature, the method further comprising:

forming a third active region over the substrate, wherein the second portion of the gate structure also engages the third active region in forming a pull-up transistor of the memory circuit;

forming a third source/drain feature of the pull-up transistor; and forming a second backside conductive feature landing on a bottom surface of the third source/drain feature, wherein the first and second backside conductive features are coupled to different voltage lines of the memory circuit, and wherein in a top view, an area of the first backside conductive feature is larger than that of the second backside conductive feature.

16. The method of claim 15, wherein the first backside conductive feature is coupled to a lower voltage than the second backside conductive feature.

17. A method, comprising:

forming first and second active regions extending lengthwise along a first direction;

forming a gate stack extending lengthwise along a second direction different from the first direction;

forming a gate-cut feature dividing the gate stack into a first segment over the first active region and a second segment over the second active region, the gate-cut feature extending lengthwise along the first direction and disposed between the first and second active regions;

epitaxially growing a first epitaxial feature on the first active region;

epitaxially growing a second epitaxial feature on the second active region, the first and second epitaxial features disposed on two opposing sides of the gate-cut feature;

forming a backside conductive feature electrically coupled to the first and second epitaxial features, the backside conductive feature including a first leg portion landing on a bottom surface of the first epitaxial feature, a second leg portion landing on a bottom surface of the second epitaxial feature, and a middle portion positioned under the gate-cut feature and physically connecting the first and second leg portions; and performing a planarization process to planarize a bottom surface of the backside conductive feature, wherein after the performing of the planarization process the middle portion of the backside conductive feature remains connecting the first and second leg portions.

18. The method of claim 17, wherein the middle portion interfaces with the gate-cut feature.

19. The method of claim 17, further comprising:

forming a frontside contact disposed on the first and second epitaxial features, wherein the gate-cut feature is vertically stacked between the frontside contact and the backside conductive feature.

20. The method of claim 17, further comprising:
   forming a frontside contact feature over and electrically
      coupled to the first and second epitaxial features.

\* \* \* \* \*